(12) United States Patent
Ramkumar

(10) Patent No.: US 8,283,261 B2
(45) Date of Patent: *Oct. 9, 2012

(54) RADICAL OXIDATION PROCESS FOR FABRICATING A NONVOLATILE CHARGE TRAP MEMORY DEVICE

(75) Inventor: Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 87 days.

This patent is subject to a terminal disclaimer.

(21) Appl. No.: 12/124,855

(22) Filed: May 21, 2008

(65) Prior Publication Data

US 2008/0293255 A1    Nov. 27, 2008

Related U.S. Application Data

(60) Provisional application No. 60/940,139, filed on May 25, 2007, provisional application No. 60/986,637, filed on Nov. 9, 2007.

(51) Int. Cl.
 *H01L 21/31* (2006.01)
(52) U.S. Cl. ........ 438/758; 438/257; 438/769; 438/770; 438/774; 438/786; 257/E21.24
(58) Field of Classification Search .................. 438/758, 438/769–774, 786, 954, 257, 261; 257/E21.24
See application file for complete search history.

(56) References Cited

U.S. PATENT DOCUMENTS

| | | |
|---|---|---|
| 4,395,438 A | 7/1983 | Chiang |
| 4,490,900 A | 1/1985 | Chiu |
| 4,870,470 A | 9/1989 | Bass et al. |
| 5,408,115 A | 4/1995 | Chang |
| 5,464,783 A | 11/1995 | Kim et al. |
| 5,937,323 A | 8/1999 | Orczyk et al. |
| 5,939,333 A | 8/1999 | Hurley et al. |
| 5,972,804 A | 10/1999 | Tobin et al. |
| 6,020,606 A | 2/2000 | Liao |
| 6,150,286 A | 11/2000 | Sun et al. |
| 6,162,700 A | 12/2000 | Hwang et al. |
| 6,217,658 B1 | 4/2001 | Orczyk et al. |
| 6,268,299 B1 | 7/2001 | Jammy et al. |
| 6,297,173 B1 | 10/2001 | Tobin et al. |
| 6,335,288 B1 | 1/2002 | Kwan et al. |
| 6,348,380 B1 | 2/2002 | Weimer et al. |
| 6,365,518 B1 * | 4/2002 | Lee et al. ...................... 438/687 |
| 6,399,484 B1 | 6/2002 | Yamasaki et al. |

(Continued)

FOREIGN PATENT DOCUMENTS

CN    101558481 A    10/2009

OTHER PUBLICATIONS

International Search Report and Written Opinion of the International Searching Authority, PCT/US08/06627 filed May 23, 2008, mailed Aug. 26, 2008.

(Continued)

*Primary Examiner* — Thanh Nguyen

(57) ABSTRACT

A method for fabricating a nonvolatile charge trap memory device is described. The method includes providing a substrate having a charge-trapping layer disposed Thereon. A portion of the charge-trapping layer is then oxidized to form a blocking dielectric layer above the charge-trapping layer by exposing the charge-trapping layer to a radical oxidation process.

6 Claims, 16 Drawing Sheets

U.S. PATENT DOCUMENTS

| | | | |
|---|---|---|---|
| 6,406,960 B1 | 6/2002 | Hopper et al. | |
| 6,445,030 B1 | 9/2002 | Wu et al. | |
| 6,468,927 B1 | 10/2002 | Zhang et al. | |
| 6,559,026 B1 | 5/2003 | Rossman et al. | |
| 6,586,343 B1 | 7/2003 | Ho et al. | |
| 6,602,771 B2 | 8/2003 | Inoue et al. | |
| 6,709,928 B1 | 3/2004 | Jenne et al. | |
| 6,713,127 B2 | 3/2004 | Subramony et al. | |
| 6,818,558 B1 * | 11/2004 | Rathor et al. | 438/694 |
| 6,835,621 B2 | 12/2004 | Yoo et al. | |
| 7,033,957 B1 | 4/2006 | Shiraiwa et al. | |
| 7,112,486 B2 | 9/2006 | Cho et al. | |
| 2005/0266637 A1 * | 12/2005 | Wang | 438/257 |
| 2006/0228899 A1 * | 10/2006 | Nansei et al. | 438/769 |
| 2007/0210371 A1 * | 9/2007 | Hisamoto et al. | 257/316 |
| 2008/0293255 A1 * | 11/2008 | Ramkumar | 438/770 |
| 2009/0011609 A1 | 1/2009 | Ramkumar et al. | |

OTHER PUBLICATIONS

USPTO Notice of Allowance for U.S. Appl. No. 10/185,470 dated Jul. 16, 2004; 4 pages.

USPTO Non-Final Rejection for U.S. Appl. No. 10/185,470 dated Feb. 24, 2004; 6 pages.

USPTO Non-Final Rejection for U.S. Appl. No. 10/185,470 dated Oct. 16, 2003; 7 pages.

USPTO Notice of Allowance for U.S. Appl. No. 09/920,378 dated Nov. 10, 2003; 5 pages.

USPTO Advisory Action for U.S. Appl. No. 09/920,378 dated Sep. 5, 2003; 3 pages.

USPTO Advisory Action for U.S. Appl. No. 09/920,378 dated Jun. 25, 2003; 3 pages.

USPTO Final Rejection for U.S. Appl. No. 09/920,378 dated Mar. 28, 2003; 6 pages.

USPTO Non-Final Rejection for U.S. Appl. No. 09/920,378 dated Oct. 21, 2002; 10 pages.

USPTO Requirement for Restriction/Election for U.S. Appl. No. 09/920,378 dated Jul. 22, 2002; 4 pages.

Milton Ohring, "The Materials Science of Thin Films: Deposition and Structure," 2nd Edition, Academic Press, 2002, pp. 336-337; 4 pages.

U.S. Appl. No. 12/197,466 "Radical Oxidation Process for Fabricating a Nonvolatile Charge Trap Memory Device," Ramkumar et al., filed on Aug. 25, 2008; 68 pages.

USPTO Requirement Restriction for U.S. Appl. No. 12/197,466 dated Mar. 11, 2011; 5 pages.

USPTO Non-Final Rejection for U.S. Appl. No. 12/197,466 dated Jun. 1, 2011; 11 pages.

U.S. Appl. No. 13/539,458: "Radical Oxidation Process for Fabricating a Nonvolatile Charge Trap Memory Device", filed on Jul. 1, 2012; 96 pages.

Application No. 60/940,139 "Radical Oxidation for In-Situ ONO Deposition" filed May 25, 2007; 3 pages.

Application No. 60/986,637 "Single Wafer Radical Oxidation for ONO Stack With Bilayer Oxynitride"; filed Nov. 9, 2007; 1 page.

Chinese Office Action for Application No. 20080000820.3 dated Jan. 26, 2011; 6 pages.

International Search Report and Written Opinion for Application No. PCT/US08/06627 dated Aug. 26, 2008; 3 pages.

USPTO Advisory Action for U.S. Appl. No. 12/197,466 dated Jan. 31, 2012; 3 pages.

USPTO Final Rejection for U.S. Appl. No. 12/197,466 dated Nov. 17, 2011; 13 pages.

USPTO Notice of Allowance for U.S. Appl. No. 12/197,466 dated Jun. 15, 2012; 4 pages.

* cited by examiner

US 8,283,261 B2

RADICAL OXIDATION PROCESS FOR FABRICATING A NONVOLATILE CHARGE TRAP MEMORY DEVICE

CROSS REFERENCE TO RELATED APPLICATIONS

This application claims the benefit of U.S. Provisional Application No. 60/940,139, filed May 25, 2007, and U.S. Provisional Application No. 60/986,637, filed Nov. 9, 2007, the entire contents of which are hereby incorporated by reference herein.

TECHNICAL FIELD

Embodiments of the present invention are in the field of Semiconductor Fabrication and, in particular, Semiconductor Device Fabrication.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Non-volatile semiconductor memories typically use stacked floating gate type field-effect-transistors. In such transistors, electrons are injected into a floating gate of a memory cell to be programmed by biasing a control gate and grounding a body region of a substrate on which the memory cell is formed. An oxide-nitride-oxide (ONO) stack is used as either a charge storing layer, as in a semiconductor-oxide-nitride-oxide-semiconductor (SONOS) transistor, or as an isolation layer between the floating gate and control gate, as in a split gate flash transistor. FIG. 1 illustrates a cross-sectional view of a conventional nonvolatile charge trap memory device.

Referring to FIG. 1, semiconductor device 100 includes a SONOS gate stack 104 including a conventional ONO portion 106 formed over a silicon substrate 102. Semiconductor device 100 further includes source and drain regions 110 on either side of SONOS gate stack 104 to define a channel region 112. SONOS gate stack 104 includes a poly-silicon gate layer 108 formed above and in contact with ONO portion 106. Poly-silicon gate layer 108 is electrically isolated from silicon substrate 102 by ONO portion 106. ONO portion 106 typically includes a tunnel oxide layer 106A, a nitride or oxy-nitride charge-trapping layer 106B, and a top oxide layer 106C overlying nitride or oxy-nitride layer 106B.

One problem with conventional SONOS transistors is the poor data retention in the nitride or oxy-nitride layer 106B that limits semiconductor device 100 lifetime and its use in several applications due to leakage current through the layer.

DETAILED DESCRIPTION

Figure 1:
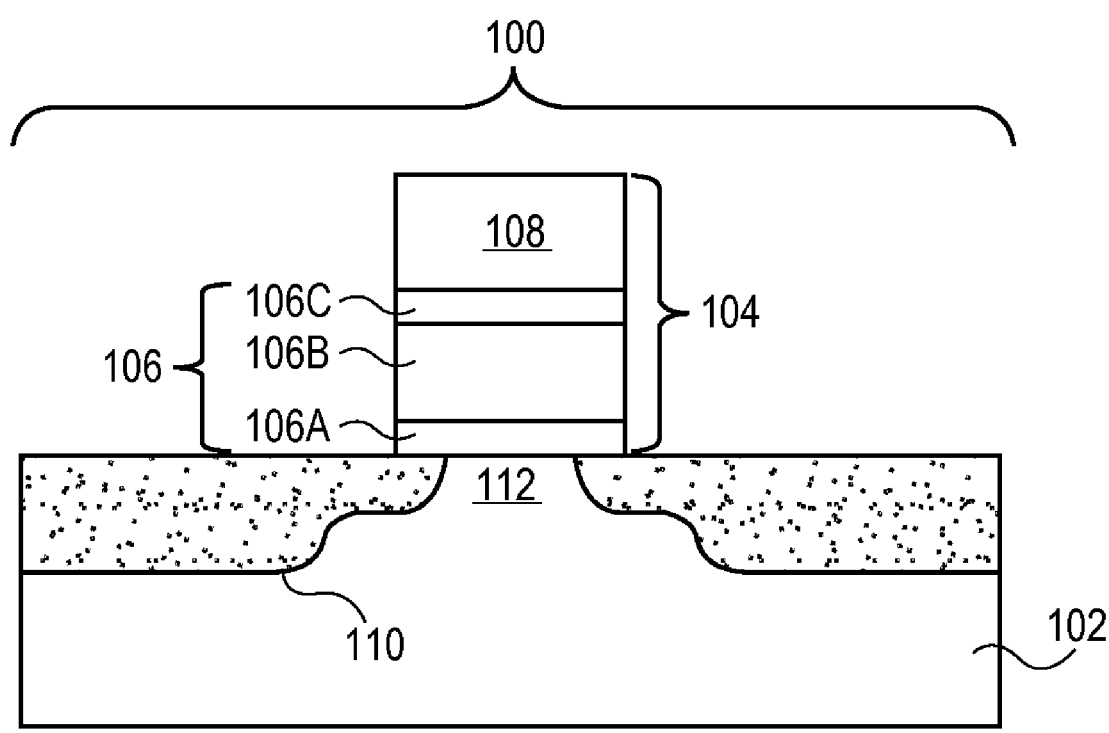
FIG. 1 illustrates a cross-sectional view of a conventional nonvolatile charge trap memory device.

Methods to fabricate a nonvolatile charge trap memory device are described herein. In the following description, numerous specific details are set forth, such as specific dimensions, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is to be understood that the various embodiments shown in the Figures are illustrative representations and are not necessarily drawn to scale.

Disclosed herein is a method to fabricate a nonvolatile charge trap memory device. A substrate may first be provided having a charge-trapping layer disposed thereon. In one embodiment, a portion of the charge-trapping layer is then oxidized to form a blocking dielectric layer above the charge-trapping layer by exposing the charge-trapping layer to a radical oxidation process.

Formation of a dielectric layer by a radical oxidation process may provide higher quality films than processes involving steam growth, i.e. wet growth processes. Furthermore, a radical oxidation process carried out in a batch-processing chamber may provide high quality films without impacting the throughput (wafers/Hr) requirements that a fabrication facility may require. By carrying out the radical oxidation process at temperatures compatible with such a chamber, such as temperatures approximately in the range of 600-900 degrees Celsius, the thermal budget tolerated by the substrate and any other features on the substrate may not be impacted to the extent typical of processes over 1000 degrees Celsius. In accordance with an embodiment of the present invention, a radical oxidation process involving flowing hydrogen ($H_2$) and oxygen ($O_2$) gas into a batch-processing chamber is carried out to effect growth of a dielectric layer by oxidation consumption of an exposed substrate or film. In one embodiment, multiple radical oxidation processes are carried out to provide a tunnel dielectric layer and a blocking dielectric layer for a non-volatile charge trap memory device. These dielectric layers may be of very high quality, even at a reduced thickness. In one embodiment, the tunnel dielectric layer and the blocking dielectric layer are both denser and are composed of substantially fewer hydrogen atoms/$cm^3$ than a tunnel dielectric layer or a blocking dielectric layer formed by wet oxidation techniques. In accordance with another embodiment of the present invention, a dielectric layer formed by carrying out a radical oxidation process is less susceptible to crystal plane orientation differences in the substrate from which it is grown. In one embodiment, the cornering effect caused by differential crystal plane oxidation rates is significantly reduced by forming a dielectric layer via a radical oxidation process.

Figure 2:
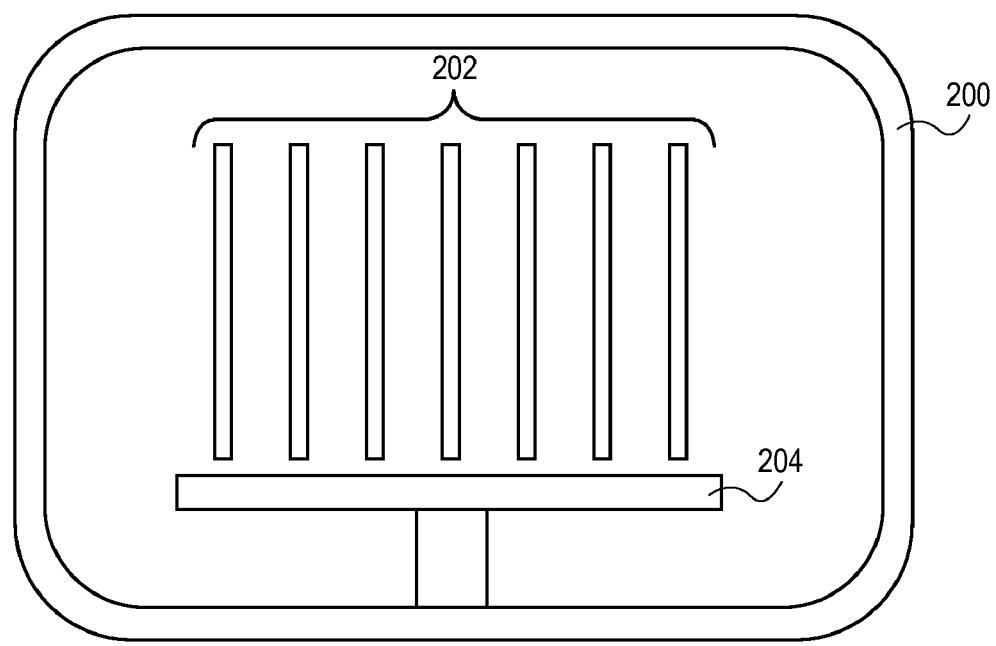
FIG. 2 illustrates a cross-sectional view of an oxidation chamber of a batch-processing tool, in accordance with an embodiment of the present invention.

A portion of a nonvolatile charge trap memory device may be fabricated by carrying out a radical oxidation process in a process chamber. In accordance with an embodiment of the present invention, the process chamber is a batch-processing chamber. FIG. 2 illustrates a cross-sectional view of an oxidation chamber of a batch-processing tool, in accordance with that embodiment. Referring to FIG. 2, a batch-processing chamber 200 includes a carrier apparatus 204 to hold a plurality of semiconductor wafers 202. In one embodiment, the batch-processing chamber is an oxidation chamber. In a specific embodiment, the process chamber is a low-pressure chemical vapor deposition chamber. The plurality of semiconductor wafers 202 may be arranged in such a way as to maximize exposure of each wafer to a radical oxidation process, while enabling the inclusion of a reasonable number of wafers (e.g. 25 wafers), to be processed in a single pass. It should be understood, however, that the present invention is not limited to a batch-processing chamber.

Figure 3:
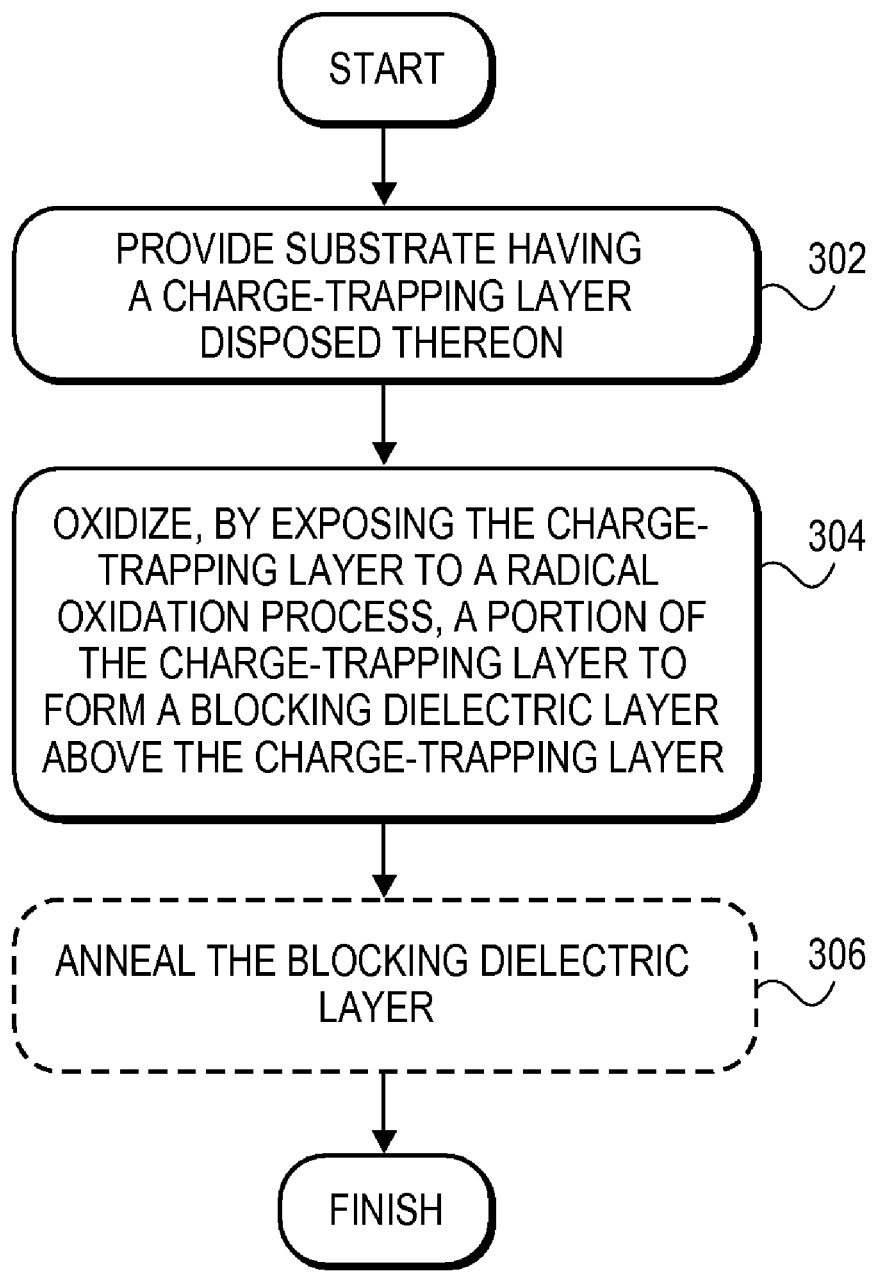
FIG. 3 depicts a Flowchart representing a series of operations in a method for fabricating a nonvolatile charge trap memory device, in accordance with an embodiment of the present invention.
Figure 4A:
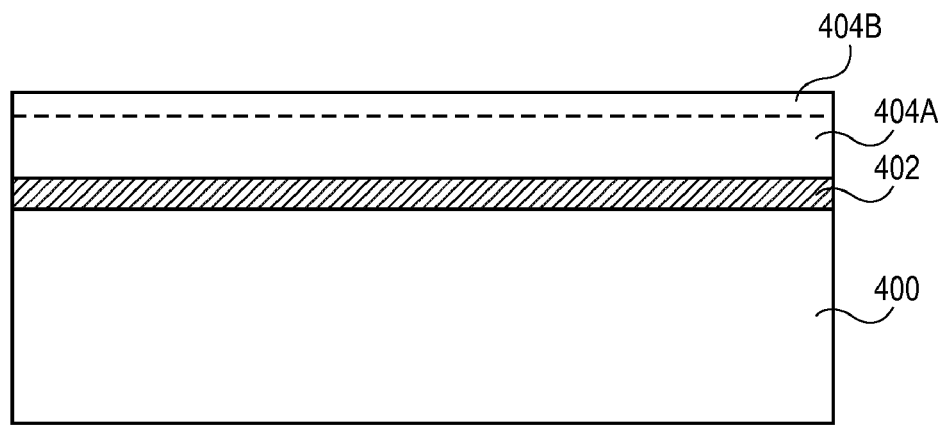
FIG. 4A illustrates a cross-sectional view of a substrate having a charge-trapping layer formed thereon, corresponding to operation 302 from the Flowchart of FIG. 3, in accordance with an embodiment of the present invention.
Figure 4B:
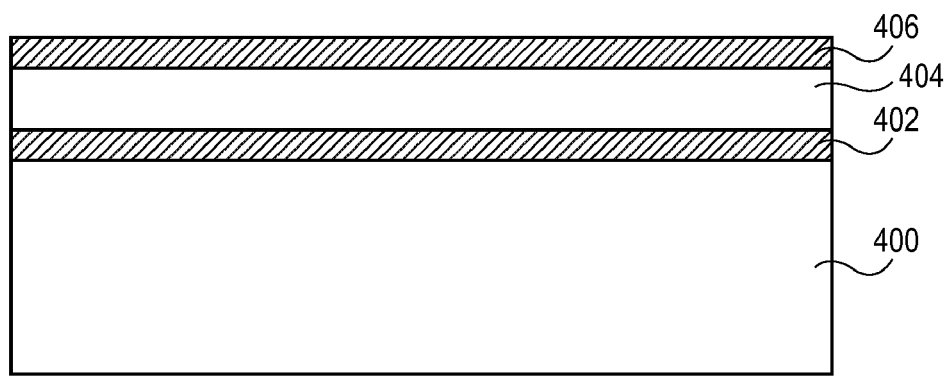
FIG. 4B illustrates a cross-sectional view of a substrate having a charge-trapping layer with a blocking dielectric layer formed thereon, corresponding to operation 304 from the Flowchart of FIG. 3, in accordance with an embodiment of the present invention.

In an aspect of the present invention, a portion of a non-volatile charge trap memory device is fabricated by a radical oxidation process. FIG. 3 depicts a Flowchart representing a series of operations in a method for fabricating a nonvolatile charge trap memory device, in accordance with an embodiment of the present invention. FIGS. 4A-4B illustrate cross-sectional views representing operations in the fabrication of a nonvolatile charge trap memory device, in accordance with an embodiment of the present invention.

FIG. 4A illustrates a cross-sectional view of a substrate having a charge-trapping layer formed thereon, corresponding to operation 302 from the Flowchart of FIG. 3, in accordance with an embodiment of the present invention. Referring to operation 302 of Flowchart 300 and corresponding FIG. 4A, a substrate 400 is provided having a charge-trapping layer disposed thereon. In an embodiment, the charge-trapping layer has a first region 404A and a second region 404B disposed above substrate 400. In one embodiment, a dielectric layer 402 is disposed between substrate 400 and the charge-trapping layer, as depicted in FIG. 4A. The charge-trapping layer may be composed of a material and have a thickness suitable to store charge and, hence, change the threshold voltage of a subsequently formed gate stack. In an embodiment, region 404A of the charge-trapping layer will remain as an intact charge-trapping layer following subsequent process operations. However, in that embodiment, region 404B of the as-formed charge-trapping layer will be consumed to form a second dielectric layer, above region 404A.

FIG. 4B illustrates a cross-sectional view of a substrate having a charge-trapping layer with a blocking dielectric layer formed thereon, corresponding to operation 304 from the Flowchart of FIG. 3, in accordance with an embodiment of the present invention. Referring to operation 304 of Flowchart 300 and corresponding FIG. 4B, a blocking dielectric layer 406 is formed on charge-trapping layer 404. In accordance with an embodiment of the present invention, blocking dielectric layer 406 is formed by oxidizing region 404B of the charge-trapping layer by exposing the charge-trapping layer to a radical oxidation process. In that embodiment, region 404A of the original charge-trapping layer is now labeled as charge-trapping layer 404.

Blocking dielectric layer 406 may be composed of a material and have a thickness suitable to maintain a barrier to charge leakage without significantly decreasing the capacitance of a subsequently formed gate stack in a nonvolatile charge trap memory device. In a specific embodiment, region 404B is a silicon-rich silicon oxy-nitride region having a thickness approximately in the range of 2-3 nanometers and is oxidized to form blocking dielectric layer 406 having a thickness approximately in the range of 3.5-4.5 nanometers. In that embodiment, blocking dielectric layer 406 is composed of silicon dioxide.

Blocking dielectric layer 406 may be formed by a radical oxidation process. In accordance with an embodiment of the present invention, the radical oxidation process involves flowing hydrogen ($H_2$) and oxygen ($O_2$) gas into a furnace, such as the batch processing chamber 200 described in association with FIG. 2. In one embodiment, the partial pressures of $H_2$ and $O_2$ have a ratio to one another of approximately 1:1. However, in an embodiment, an ignition event is not carried out which would otherwise typically be used to pyrolyze the $H_2$ and $O_2$ to form steam. Instead, $H_2$ and $O_2$ are permitted to react to form radicals at the surface of region 404B. In one embodiment, the radicals are used to consume region 404B to provide blocking dielectric layer 406. In a specific embodiment, the radical oxidation process includes oxidizing with a radical such as, but not limited to, an OH radical, an $HO_2$ radical or an O diradical at a temperature approximately in the range of 600-900 degrees Celsius. In a particular embodiment, the radical oxidation process is carried out at a temperature approximately in the range of 700-800 degrees Celsius at a pressure approximately in the range of 0.5-5 Torr. In one embodiment, the second radical oxidation process is carried out for a duration approximately in the range of 100-150 minutes.

Referring to operation 306 of Flowchart 300, blocking dielectric layer 406 may be further subjected to a nitridation process in the first process chamber. In accordance with an embodiment of the present invention, the nitridation process includes annealing blocking dielectric layer 406 in an atmosphere including nitrogen at a temperature approximately in the range of 700-800 degrees Celsius for a duration approximately in the range of 5 minutes-60 minutes. In one embodiment, the atmosphere including nitrogen is composed of a gas such as, but not limited to, nitrogen ($N_2$), nitrous oxide ($N_2O$), nitrogen dioxide ($NO_2$), nitric oxide (NO) or ammonia ($NH_3$). Alternatively, this nitridation step, i.e. operation 306 from Flowchart 300, may be skipped.

Figure 5:
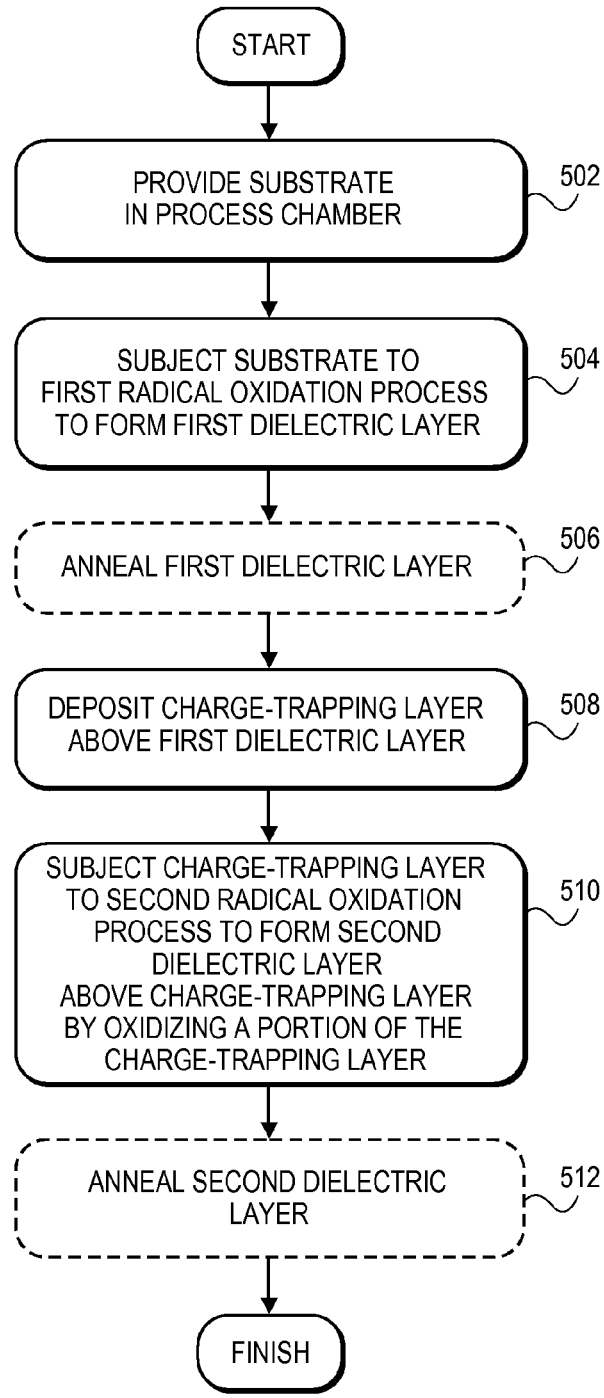
FIG. 5 depicts a Flowchart representing a series of operations in a method for fabricating a nonvolatile charge trap memory device, in accordance with an embodiment of the present invention.

In an aspect of the present invention, both a tunnel dielectric layer and a blocking dielectric layer may be formed by radical oxidation processes. FIG. 5 depicts a Flowchart 500 representing a series of operations in a method for fabricating a nonvolatile charge trap memory device, in accordance with an embodiment of the present invention. FIGS. 6A-6E illustrate cross-sectional views representing operations in the fabrication of a nonvolatile charge trap memory device, in accordance with an embodiment of the present invention.

Figure 6A:
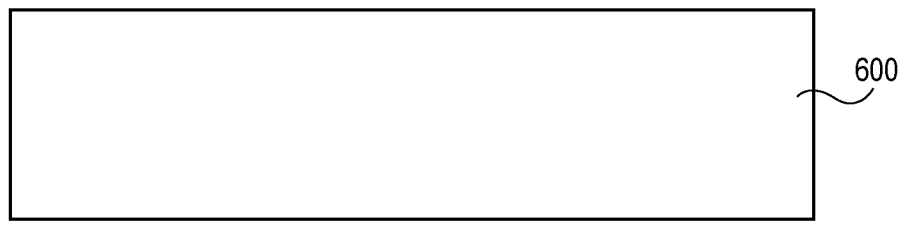
FIG. 6A illustrates a cross-sectional view of a substrate, corresponding to operation 502 from the Flowchart of FIG. 5, in accordance with an embodiment of the present invention.

FIG. 6A illustrates a cross-sectional view of a substrate, corresponding to operation 502 from the Flowchart of FIG. 5, in accordance with an embodiment of the present invention. Referring to operation 502 of Flowchart 500 and corresponding FIG. 6A, a substrate 600 is provided in a process chamber.

Substrate 600 may be composed of a material suitable for semiconductor device fabrication. In one embodiment, substrate 600 is a bulk substrate composed of a single crystal of a material which may include, but is not limited to, silicon, germanium, silicon-germanium or a III-V compound semiconductor material. In another embodiment, substrate 600 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 600 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 600 may further include dopant impurity atoms.

Figure 6B:
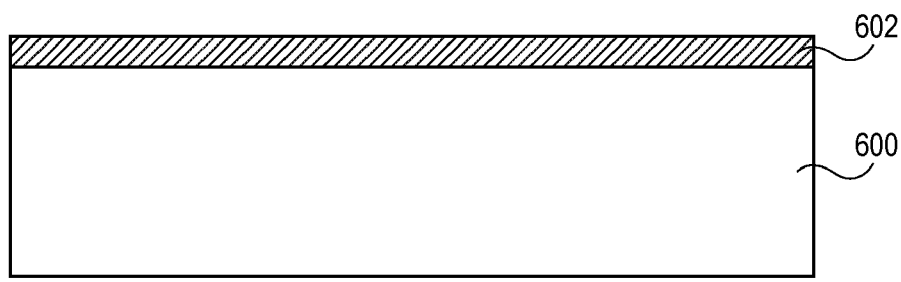
FIG. 6B illustrates a cross-sectional view of a substrate having a first dielectric layer formed thereon, corresponding to operation 504 from the Flowchart of FIG. 5, in accordance with an embodiment of the present invention.

FIG. 6B illustrates a cross-sectional view of a substrate having a dielectric layer formed thereon, corresponding to operation 504 from the Flowchart of FIG. 5, in accordance with an embodiment of the present invention. Referring to operation 504 of Flowchart 500 and corresponding FIG. 6B, substrate 600 is subjected to a first radical oxidation process to form a first dielectric layer 602.

First dielectric layer 602 may be composed of a material and have a thickness suitable to allow charge carriers to tunnel into a subsequently formed charge-trapping layer under an applied gate bias, while maintaining a suitable barrier to leakage when a subsequently formed nonvolatile charge trap memory device is unbiased. First dielectric layer 602 may be referred to in the art as a tunnel dielectric layer. In accordance with an embodiment of the present invention, first dielectric layer 602 is formed by an oxidation process where the top surface of substrate 600 is consumed. Thus, in an embodiment, first dielectric layer 602 is composed of an oxide of the material of substrate 600. For example, in one embodiment, substrate 600 is composed of silicon and first dielectric layer 602 is composed of silicon dioxide. In a specific embodiment, first dielectric layer 602 is formed to a thickness approximately in the range of 1-10 nanometers. In a particular embodiment, first dielectric layer 602 is formed to a thickness approximately in the range of 1.5-2.5 nanometers.

First dielectric layer 602 may be formed by a radical oxidation process. In accordance with an embodiment of the present invention, the radical oxidation process involves flowing hydrogen ($H_2$) and oxygen ($O_2$) gas into a furnace, such as the batch processing chamber 200 described in association with FIG. 2. In one embodiment, the partial pressures of $H_2$ and $O_2$ have a ratio to one another of approximately 1:1. However, in an embodiment, an ignition event is not carried out which would otherwise typically be used to pyrolyze the $H_2$ and $O_2$ to form steam. Instead, $H_2$ and $O_2$ are permitted to react to form radicals at the surface of substrate 600. In one embodiment, the radicals are used to consume the top portion of substrate 600 to provide first dielectric layer 602. In a specific embodiment, the radical oxidation process includes oxidizing with a radical such as, but not limited to, an OH radical, an $HO_2$ radical or an O diradical at a temperature approximately in the range of 600-900 degrees Celsius. In a particular embodiment, the radical oxidation process is carried out at a temperature approximately in the range of 700-800 degrees Celsius at a pressure approximately in the range of 0.5-5 Torr. In one embodiment, the radical oxidation process is carried out for a duration approximately in the range of 100-150 minutes. In accordance with an embodiment of the present invention, first dielectric layer 602 is formed as a high-density, low-hydrogen-content film.

Referring to operation 506 of Flowchart 500, subsequent to forming first dielectric layer 602, but prior to any further processing, first dielectric layer 602 may be subjected to a nitridation process. In an embodiment, the nitridation process is carried out in the same process chamber used to form first dielectric layer 502, without removing substrate 600 from the process chamber between process steps. In one embodiment, the annealing includes heating substrate 600 in an atmosphere including nitrogen at a temperature approximately in the range of 700-800 degrees Celsius for a duration approximately in the range of 5 minutes-60 minutes. In one embodiment, the atmosphere including nitrogen is composed of a gas such as, but not limited to, nitrogen ($N_2$), nitrous oxide ($N_2O$), nitrogen dioxide ($NO_2$), nitric oxide (NO) or ammonia ($NH_3$). In one embodiment, the nitridation occurs following a nitrogen or argon purge of the process chamber following the first radical oxidation process. Alternatively, the above nitridation step may be skipped.

Figure 6C:
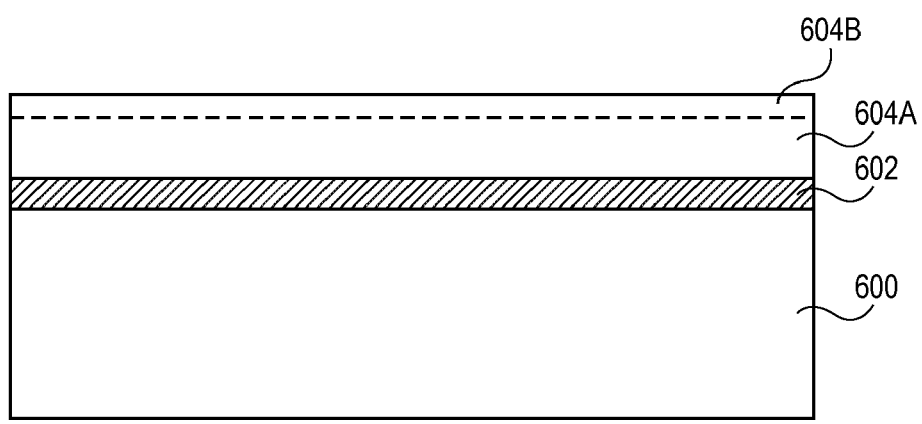
FIG. 6C illustrates a cross-sectional view of a substrate having a charge-trapping layer formed thereon, corresponding to operation 508 from the Flowchart of FIG. 5, in accordance with an embodiment of the present invention.

FIG. 6C illustrates a cross-sectional view of a substrate having a charge-trapping layer formed thereon, corresponding to operation 508 from the Flowchart of FIG. 5, in accordance with an embodiment of the present invention. Referring to operation 508 of Flowchart 500 and corresponding FIG. 6C, a charge-trapping layer having a first region 604A and a second region 604B is formed on first dielectric layer 602. In an embodiment, the formation of the charge-trapping layer is carried out in the same process chamber used to form first dielectric layer 602, without removing substrate 600 from the process chamber between process steps.

The charge-trapping layer may be composed of a material and have a thickness suitable to store charge and, hence, change the threshold voltage of a subsequently formed gate stack. In accordance with an embodiment of the present invention, the charge-trapping layer is composed of two regions 604A and 604B, as depicted in FIG. 6C. In an embodiment, region 604A of the charge-trapping layer will remain as an intact charge-trapping layer following subsequent process operations. However, in that embodiment, region 604B of the as-formed charge-trapping layer will be consumed to form a second dielectric layer, above region 604A.

The charge-trapping layer having regions 604A and 604B may be formed by a chemical vapor deposition process. In accordance with an embodiment of the present invention, the charge-trapping layer is composed of a material such as, but not limited to, silicon nitride, silicon oxy-nitride, oxygen-rich silicon oxy-nitride or silicon-rich silicon oxy-nitride. In one embodiment, regions 604A and 604B of the charge-trapping layer are formed at a temperature approximately in the range of 600-900 degrees Celsius. In a specific embodiment, the charge-trapping layer is formed by using gases such as, but not limited to, dichlorosilane ($H_2SiCl_2$), bis-(tert-butylamino)silane (BTBAS), ammonia ($NH_3$) or nitrous oxide ($N_2O$). In one embodiment, the charge-trapping layer is formed to a total thickness approximately in the range of 5-15 nanometers and region 604B accounts for a thickness approximately in the range of 2-3 nanometers of the total thickness of the charge-trapping layer. In that embodiment, region 604A accounts for the remaining total thickness of the charge-trapping layer, i.e. region 604A accounts for the portion of the charge-trapping layer that is not subsequently consumed to form a top or blocking dielectric layer.

In another aspect of the present invention, the charge-trapping layer may include multiple composition regions. For example, in accordance with an embodiment of the present invention, the charge-trapping layer includes an oxygen-rich portion and a silicon-rich portion and is formed by depositing an oxygen-rich oxy-nitride film by a first composition of gases and, subsequently, depositing a silicon-rich oxy-nitride film by a second composition of gases. In one embodiment, the charge-trapping layer is formed by modifying the flow rate of ammonia ($NH_3$) gas, and introducing nitrous oxide ($N_2O$) and dichlorosilane ($SiH_2Cl_2$) to provide the desired gas ratios to yield first an oxygen-rich oxy-nitride film and then a silicon-rich oxy-nitride film. In a specific embodiment, the oxygen-rich oxy-nitride film is formed by introducing a process gas mixture including $N_2O$, $NH_3$ and $SiH_2Cl_2$, while maintaining the process chamber at a pressure approximately in the range of 5-500 mTorr, and maintaining substrate 600 at a temperature approximately in the range of 700-850 degrees Celsius, for a period approximately in the range of 2.5-20 minutes. In a further embodiment, the process gas mixture includes $N_2O$ and $NH_3$ having a ratio of from about 8:1 to about 1:8 and $SiH_2Cl_2$ and $NH_3$ having a ratio of from about 1:7 to about 7:1, and can be introduced at a flow rate approximately in the range of 5-200 standard cubic centimeters per minute (sccm). In another specific embodiment, the silicon-rich oxy-nitride film is formed by introducing a process gas mixture including $N_2O$, $NH_3$ and $SiH_2Cl_2$, while maintaining the chamber at a pressure approximately in the range of 5-500 mTorr, and maintaining substrate 600 at a temperature approximately in the range of 700-850 degrees Celsius, for a period approximately in the range of 2.5-20 minutes. In a further embodiment, the process gas mixture includes $N_2O$ and $NH_3$ having a ratio of from about 8:1 to about 1:8 and $SiH_2Cl_2$ and $NH_3$ mixed in a ratio of from about 1:7 to about 7:1, introduced at a flow rate of from about 5 to about 20 sccm. In accordance with an embodiment of the present invention, the charge-trapping layer comprises a bottom oxygen-rich silicon oxy-nitride portion having a thickness approximately in the range of 2.5-3.5 nanometers and a top silicon-rich silicon oxy-nitride portion having a thickness approximately in the range of 9-10 nanometers. In one embodiment, a region 504B of charge-trapping layer accounts for a thickness approximately in the range of 2-3 nanometers of the total thickness of the top silicon-rich silicon oxy-nitride portion of the charge-trapping layer. Thus, region 604B, which is targeted for subsequent consumption to form a second dielectric layer, may be composed entirely of silicon-rich silicon oxy-nitride.

Figure 6D:
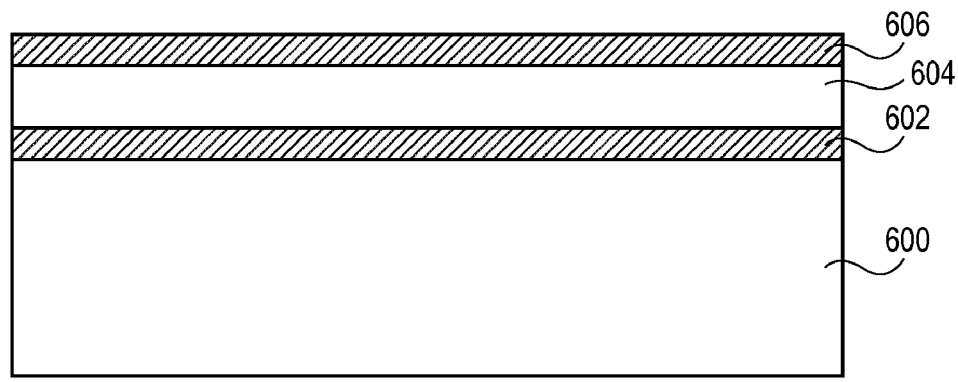
FIG. 6D illustrates a cross-sectional view of a substrate having a charge-trapping layer with a blocking dielectric layer formed thereon, corresponding to operation 510 from the Flowchart of FIG. 5, in accordance with an embodiment of the present invention.

FIG. 6D illustrates a cross-sectional view of a substrate having a second dielectric layer formed thereon, corresponding to operation 510 from the Flowchart of FIG. 5, in accordance with an embodiment of the present invention. Referring to operation 510 of Flowchart 500 and corresponding FIG.

6D, a second dielectric layer 606 is formed on charge-trapping layer 604. In an embodiment, the formation of second dielectric layer 606 is carried out in the same process chamber used to form first dielectric layer 602 and the charge-trapping layer, without removing substrate 600 from the process chamber between process steps. In one embodiment, the second radical oxidation process is carried out following a nitrogen or argon purge of the process chamber following the deposition of the charge-trapping layer.

Second dielectric layer 606 may be composed of a material and have a thickness suitable to maintain a barrier to charge leakage without significantly decreasing the capacitance of a subsequently formed gate stack in a nonvolatile charge trap memory device. Second dielectric layer 606 may be referred to in the art as a blocking dielectric layer or a top dielectric layer. In accordance with an embodiment of the present invention, second dielectric layer 606 is formed by consuming region 604B of the charge-trapping layer formed in operation 508, described in association with FIG. 6C. Thus, in one embodiment, region 604B is consumed to provide second dielectric layer 606, while region 604A remains a charge-trapping layer 604. In a specific embodiment, region 604B is a silicon-rich silicon oxy-nitride region having a thickness approximately in the range of 2-3 nanometers and is oxidized to form second dielectric layer 606 having a thickness approximately in the range of 3.5-4.5 nanometers. In that embodiment, second dielectric layer 606 is composed of silicon dioxide. In accordance with an embodiment of the present invention, second dielectric layer 606 is formed by a second radical oxidation process, similar to the radical oxidation process carried out to form blocking dielectric layer 406, described in association with FIG. 4B. In one embodiment, referring to operation 512 of Flowchart 500, subsequent to forming second dielectric layer 606, second dielectric layer 606 is further subjected to a nitridation process similar to the nitridation process described in association with operation 506 from Flowchart 500. In a specific embodiment, the nitridation occurs following a nitrogen or argon purge of the process chamber following the second radical oxidation process. Alternatively, this nitridation step may be skipped. In accordance with an embodiment of the present invention, no additional deposition processes are used in the formation of second dielectric layer 606.

Figure 6E:
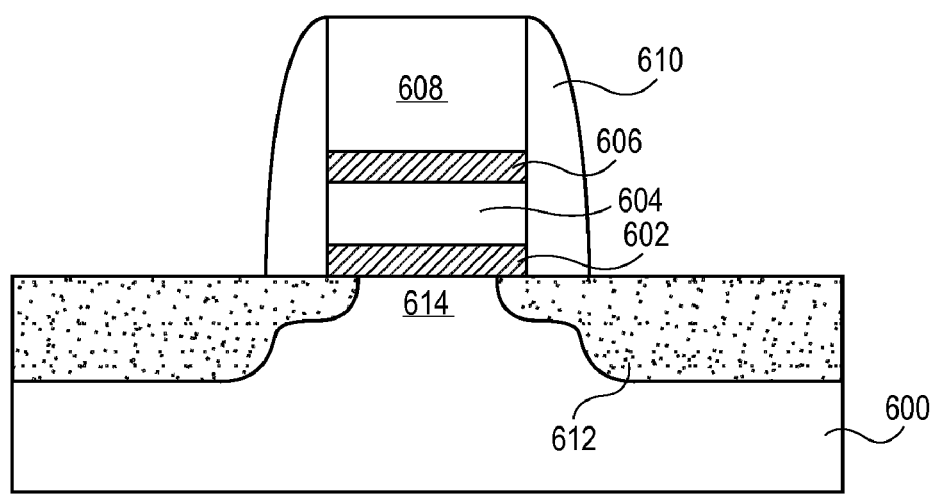
FIG. 6E illustrates a cross-sectional view of a nonvolatile charge trap memory device, in accordance with an embodiment of the present invention.

Thus, in accordance with an embodiment of the present invention, an ONO stack including first dielectric layer 602, charge-trapping layer 604 and second dielectric layer 606 is formed in a single pass in a process chamber. By fabricating these layers in a single pass of multiple wafers in the process chamber, high throughput requirements may be met while still ensuring the formation of very high quality films. Upon fabrication of an ONO stack including first dielectric layer 602, charge-trapping layer 604 and second dielectric layer 606, a nonvolatile charge trap memory device may be fabricated to include a patterned portion of the ONO stack. FIG. 6E illustrates a cross-sectional view of a nonvolatile charge trap memory device, in accordance with an embodiment of the present invention.

Referring to FIG. 6E, a nonvolatile charge trap memory device includes a patterned portion of the ONO stack formed over substrate 600. The ONO stack includes first dielectric layer 602, charge-trapping layer 604 and second dielectric layer 606. A gate layer 608 is disposed on second dielectric layer 606. The nonvolatile charge trap memory device further includes source and drain regions 612 in substrate 600 on either side of the ONO stack, defining a channel region 614 in substrate 600 underneath the ONO stack. A pair of dielectric spacers 610 isolates the sidewalls of first dielectric layer 602, charge-trapping layer 604, second dielectric layer 606 and gate layer 608. In a specific embodiment, channel region 614 is doped P-type and, in an alternative embodiment, channel region 614 is doped N-type.

In accordance with an embodiment of the present invention, the nonvolatile charge trap memory device described in association with FIG. 6E is a SONOS-type device. By convention, SONOS stands for "Semiconductor-Oxide-Nitride-Oxide-Semiconductor," where the first "Semiconductor" refers to the channel region material, the first "Oxide" refers to the tunnel dielectric layer, "Nitride" refers to the charge-trapping dielectric layer, the second "Oxide" refers to the top dielectric layer (also known as a blocking dielectric layer) and the second "Semiconductor" refers to the gate layer. Thus, in accordance with an embodiment of the present invention, first dielectric layer 602 is a tunnel dielectric layer and second dielectric layer 606 is a blocking dielectric layer.

Gate layer 608 may be composed of any conductor or semiconductor material suitable for accommodating a bias during operation of a SONOS-type transistor. In accordance with an embodiment of the present invention, gate layer 608 is formed by a chemical vapor deposition process and is composed of doped poly-crystalline silicon. In another embodiment, gate layer 608 is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt or nickel.

Source and drain regions 612 in substrate 600 may be any regions having opposite conductivity to channel region 614. For example, in accordance with an embodiment of the present invention, source and drain regions 612 are N-type doped regions while channel region 614 is a P-type doped region. In one embodiment, substrate 600 and, hence, channel region 614, is composed of boron-doped single-crystal silicon having a boron concentration in the range of $1 \times 10^{15}$-$1 \times 10^{19}$ atoms/cm$^3$. In that embodiment, source and drain regions 612 are composed of phosphorous- or arsenic-doped regions having a concentration of N-type dopants in the range of $5 \times 10^{16}$-$5 \times 10^{19}$ atoms/cm$^3$. In a specific embodiment, source and drain regions 612 have a depth in substrate 600 in the range of 80-200 nanometers. In accordance with an alternative embodiment of the present invention, source and drain regions 612 are P-type doped regions while channel region 614 is an N-type doped region.

Figure 7A:
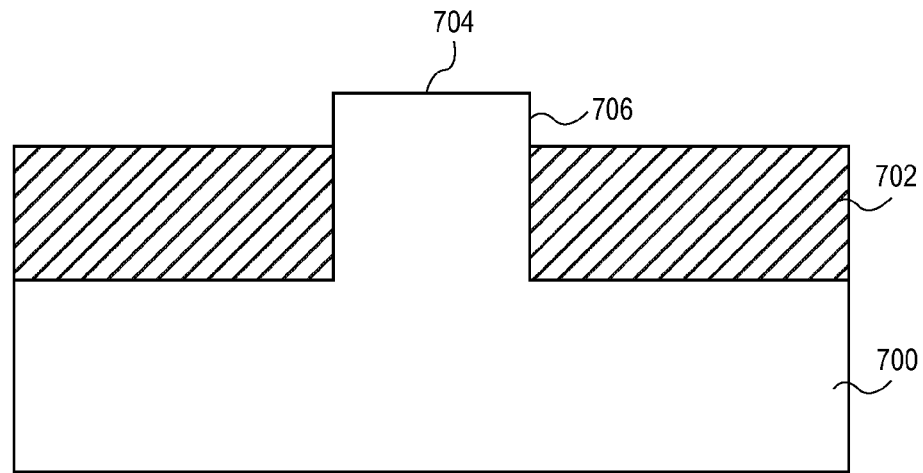
FIG. 7A illustrates a cross-sectional view of a substrate including first and second exposed crystal planes, in accordance with an embodiment of the present invention.

In another aspect of the present invention, a dielectric layer formed by radical oxidation of the top surface of a substrate in an oxidation chamber may be less susceptible to crystal plane orientation differences in the substrate upon which it is grown. For example, in one embodiment, the cornering effect caused by differential crystal plane oxidation rates is significantly reduced by forming a dielectric layer by a radical oxidation process. FIG. 7A illustrates a cross-sectional view of a substrate including first and second exposed crystal planes, in accordance with an embodiment of the present invention.

Referring to FIG. 7A, a substrate 700 has isolation regions 702 formed thereon. Substrate 700 may be composed of a material described in association with substrate 600 from FIG. 6A. Isolation regions 702 may be composed of an insulating material suitable for adhesion to substrate 700. An exposed portion of substrate 700 extends above the top surface of isolation regions 702. In accordance with an embodiment of the present invention, the exposed portion of substrate 700 has a first exposed crystal plane 704 and a second exposed crystal plane 706. In one embodiment, the crystal orientation of first exposed crystal plane 704 is different from the crystal orientation of second exposed crystal plane 706. In a specific embodiment, substrate 700 is composed of silicon, first exposed crystal plane 704 has <100> orientation, and second exposed crystal plane 706 has <110> orientation.

Figure 7B:
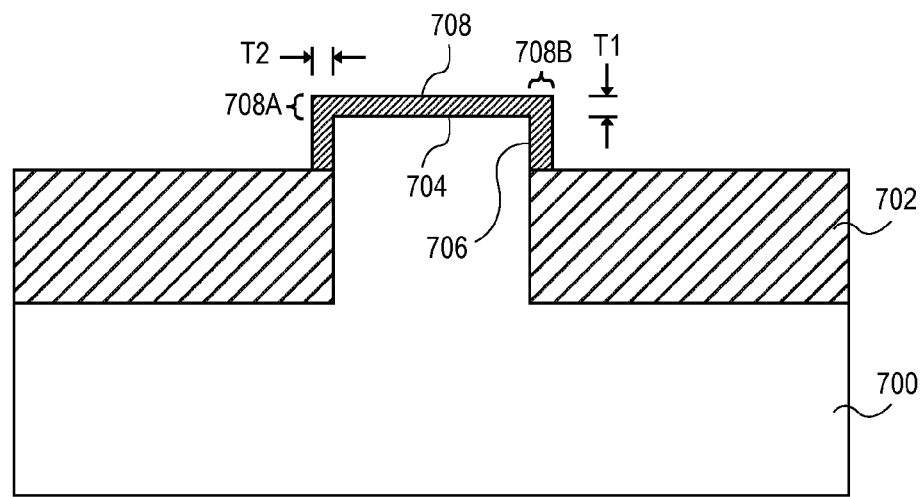
FIG. 7B illustrates a cross-sectional view of the substrate including first and second crystal planes and having a dielectric layer formed thereon, in accordance with an embodiment of the present invention.

Substrate 700 may be subjected to a radical oxidation process to form a dielectric layer by consuming (oxidizing) the top surface of substrate 700. In one embodiment, the oxidizing of substrate 700 by a radical oxidation process includes oxidizing with a radical selected from the group consisting of an OH radical, an $HO_2$ radical or an O diradical. FIG. 7B illustrates a cross-sectional view of substrate 700 including first and second crystal planes 704 and 706, respectively, and having a dielectric layer 708 formed thereon, in accordance with an embodiment of the present invention. In an embodiment, first portion 708A of dielectric layer 708 is formed on first exposed crystal plane 704 and a second portion 708B of dielectric layer 708 is formed on second exposed crystal plane 706, as depicted in FIG. 7B. In one embodiment, the thickness T1 of first portion 708A of dielectric layer 708 is approximately equal to the thickness T2 of second portion 708B of dielectric layer 708, even though the crystal plane orientation of first exposed crystal plane 704 and second exposed crystal plane 706 differ. In a specific embodiment, the radical oxidation of substrate 700 is carried out at a temperature approximately in the range of 600-900 degrees Celsius. In a specific embodiment, the radical oxidation of substrate 700 is carried out at a temperature approximately in the range of 700-800 degrees Celsius at a pressure approximately in the range of 0.5-5 Torr.

Thus, a method for fabricating a nonvolatile charge trap memory device has been disclosed. In accordance with an embodiment of the present invention, a substrate is provided having a charge-trapping layer disposed thereon. A portion of the charge-trapping layer is then oxidized to form a blocking dielectric layer above the charge-trapping layer by exposing the charge-trapping layer to a radical oxidation process.

In another aspect of the present invention, it may be desirable to use a cluster tool to carry out a radical oxidation process. Accordingly, disclosed herein is a method to fabricate a nonvolatile charge trap memory device. A substrate may first be subjected to a first radical oxidation process to form a first dielectric layer in a first process chamber of a cluster tool. In one embodiment, a charge-trapping layer is then deposited above the first dielectric layer in a second process chamber of the cluster tool. The charge-trapping layer may then be subjected to a second radical oxidation process to form a second dielectric layer above the charge-trapping layer. In one embodiment, the second dielectric layer is formed by oxidizing a portion of the charge-trapping layer in the first process chamber of the cluster tool. In a specific embodiment, the cluster tool is a single-wafer cluster tool.

Formation of a dielectric layer in a chamber of a cluster tool may permit the growth of the dielectric layer at temperatures higher than normally achievable in batch processing chambers. Furthermore, a radical oxidation process may be carried out in the chamber of the cluster tool as the primary pathway for growing the dielectric layer. In accordance with an embodiment of the present invention, a radical oxidation process involving flowing hydrogen ($H_2$) and oxygen ($O_2$) gas into an oxidation chamber of a cluster tool is carried out to effect growth of a dielectric layer by oxidation consumption of an exposed substrate or film. In one embodiment, multiple radical oxidation processes are carried out in an oxidation chamber of a cluster tool to provide a tunnel dielectric layer and a blocking dielectric layer for a non-volatile charge trap memory device. These dielectric layers may be of very high quality, even at a reduced thickness. In one embodiment, the tunnel dielectric layer and the blocking dielectric layer are both denser and are composed of substantially fewer hydrogen atoms/$cm^3$ than a tunnel dielectric layer or a blocking dielectric layer formed in a batch process chamber. Furthermore, the substrate upon which a tunnel dielectric layer and a blocking dielectric layer are formed may be exposed to a shorter temperature ramp rate and stabilization time in an oxidation chamber of a cluster tool as compared with a batch process chamber. Thus, in accordance with an embodiment of the present invention embodiment, the impact on the thermal budget of the substrate is reduced by employing a radical oxidation process in an oxidation chamber of a cluster tool. In accordance with another embodiment of the present invention, a dielectric layer formed by carrying out a radical oxidation process in an oxidation chamber of a cluster tool is less susceptible to crystal plane orientation differences in the substrate from which it is grown. In one embodiment, the cornering effect caused by differential crystal plane oxidation rates is significantly reduced by forming a dielectric layer via a radical oxidation process carried out in an oxidation chamber of a cluster tool.

Figure 8:
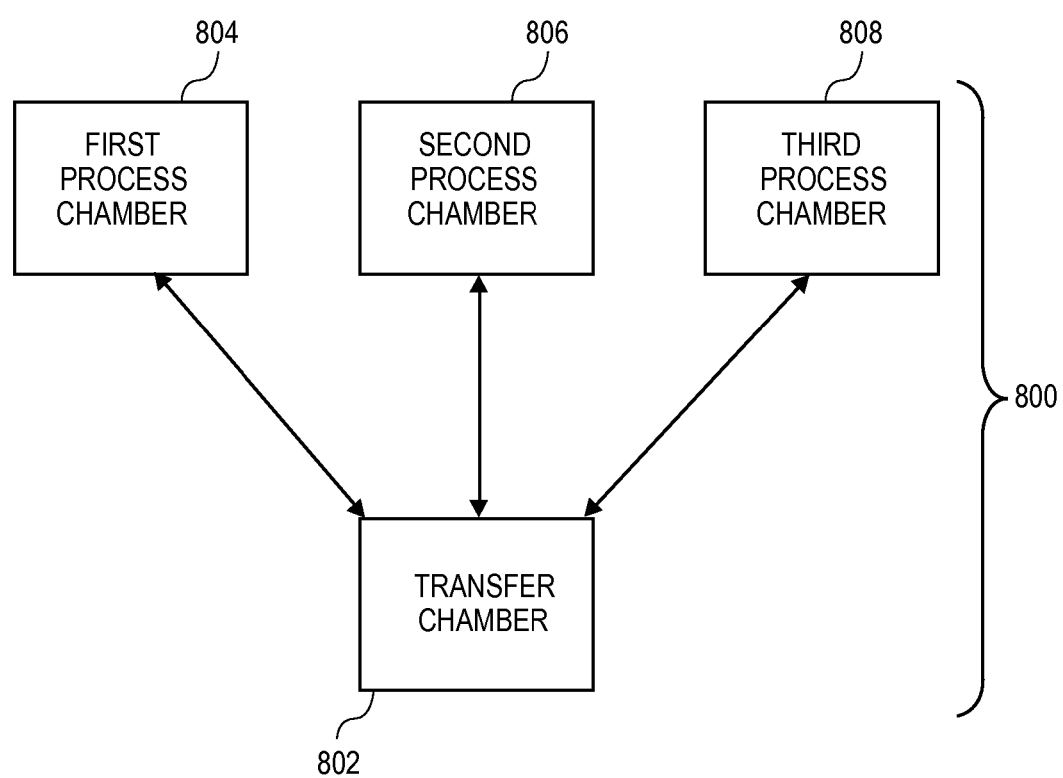
FIG. 8 illustrates an arrangement of process chambers in a cluster tool, in accordance with an embodiment of the present invention.

A portion of a nonvolatile charge trap memory device may be fabricated in a cluster tool. FIG. 8 illustrates an arrangement of process chambers in a cluster tool, in accordance with an embodiment of the present invention. Referring to FIG. 8, an arrangement of process chambers in a cluster tool 800 includes a transfer chamber 802, a first process chamber 804, a second process chamber 806 and a third process chamber 808. In an embodiment, transfer chamber 802 is for receiving a wafer from an external environment for introduction into cluster tool 800. In one embodiment, each of the process chambers 802, 804 and 806 are arranged in a way such that a wafer may be passed back- and forth between these chambers and transfer chamber 802, as depicted by the double-headed arrows in FIG. 8. In accordance with an additional embodiment of the present invention, although not shown, cluster tool 800 may be configured such that a wafer can be transferred directly between any pairing of process chambers 802, 804 or 806.

Cluster tool 800 may be any cluster tool for which an outside environment is excluded in and between process chambers 804, 806 and 808 and transfer chamber 802. Thus, in accordance with an embodiment of the present invention, once a wafer has entered process chamber 802, it is protected from an external environment as it is moved into and between process chambers 804, 806 and 808 and transfer chamber 802. An example of such a cluster tool is the Centura® platform commercially available from Applied Materials, Inc., located in Santa Clara, Calif. In one embodiment, once a wafer has been received by transfer chamber 802, a vacuum of less than approximately 100 mTorr is maintained in cluster tool 800. In accordance with an embodiment of the present invention, cluster tool 800 incorporates a chuck (or multiple chucks, e.g., one chuck for each chamber) upon which the flat surface, as opposed to the edge surface, of a wafer rests on the chuck for processing and transfer events. In one embodiment, by having the flat surface of a wafer rest on the chuck, more rapid ramp rates for heating the wafer are achievable by heating the wafer via the chuck. In a specific embodiment, cluster tool 800 is a single-wafer cluster tool.

Process chambers 802, 804 and 806 may include, but are not limited to, oxidation chambers, low-pressure chemical vapor deposition chambers, or a combination thereof. For example, in accordance with an embodiment of the present invention, first process chamber 804 is a first oxidation chamber, second process chamber 806 is a low-pressure chemical vapor deposition chamber, and third process chamber 808 is a second oxidation chamber. An example of an oxidation chamber is the In-Situ Steam Generation (ISSG) chamber from Applied Materials, Inc. Examples of low-pressure chemical vapor deposition chambers include a SiNgen™ chamber and an OXYgen™ chamber from Applied Materials, Inc. Instead of heating entire process chambers to heat a wafer, which is the case for typical batch process chambers, a chuck used for carrying a single wafer may be heated to heat the wafer. In accordance with an embodiment of the present invention, a chuck is used to heat a wafer to the desired process temperature. Thus, relatively short temperature ramp times and stabilization times may be achieved.

Figure 9:
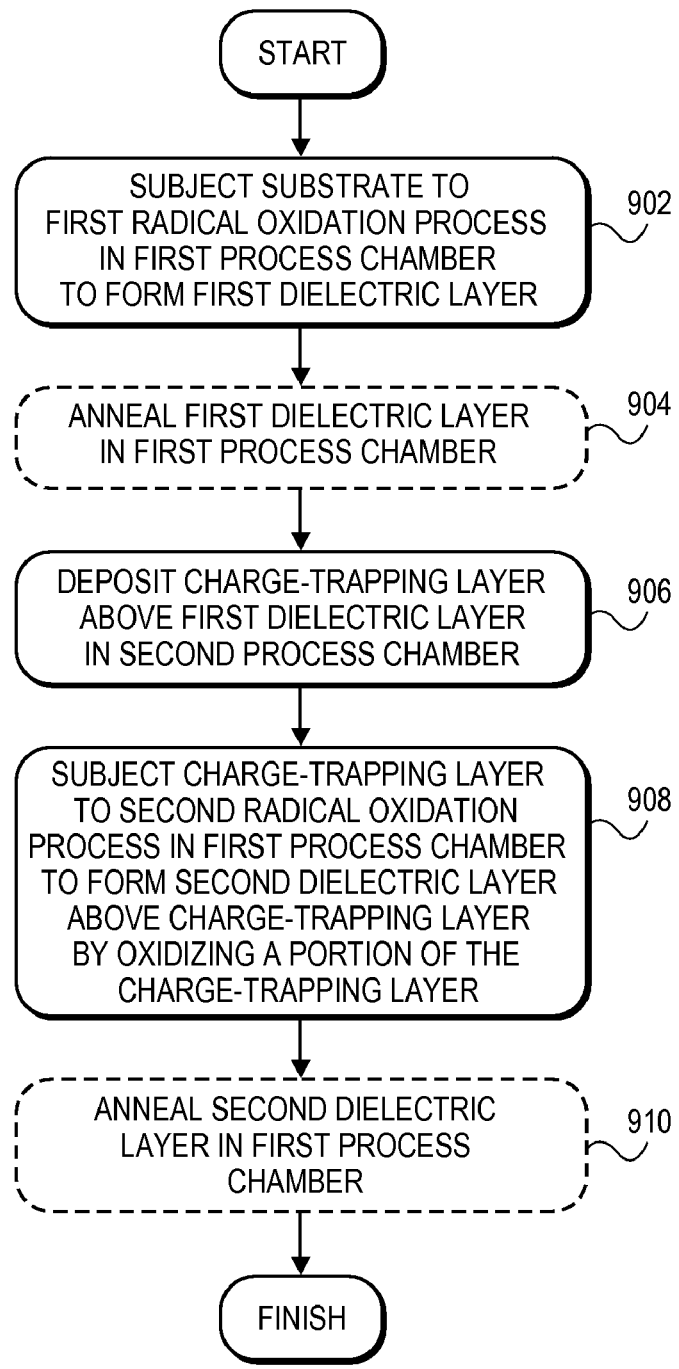
FIG. 9 depicts a Flowchart representing a series of operations in a method for fabricating a nonvolatile charge trap memory device, in accordance with an embodiment of the present invention.

A portion of a nonvolatile charge trap memory device may be fabricated in a cluster tool. FIG. 9 depicts a Flowchart 900 representing a series of operations in a method for fabricating a nonvolatile charge trap memory device, in accordance with an embodiment of the present invention. FIGS. 10A-10E illustrate cross-sectional views representing operations in the fabrication of a nonvolatile charge trap memory device, in accordance with an embodiment of the present invention.

Figure 10A:
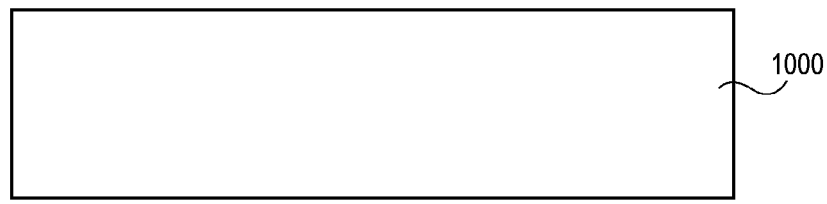
FIG. 10A illustrates a cross-sectional view of a substrate, in accordance with an embodiment of the present invention.

Referring to FIG. 10A, a substrate 1000 is provided in a cluster tool. In one embodiment, substrate 1000 is provided in a transfer chamber, such as transfer chamber 802 described in association with FIG. 8.

Substrate 1000 may be composed of any material suitable for semiconductor device fabrication. In one embodiment, substrate 1000 is a bulk substrate composed of a single crystal of a material which may include, but is not limited to, silicon, germanium, silicon-germanium or a III-V compound semiconductor material. In another embodiment, substrate 1000 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 1000 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 1000 may further include dopant impurity atoms.

Figure 10B:
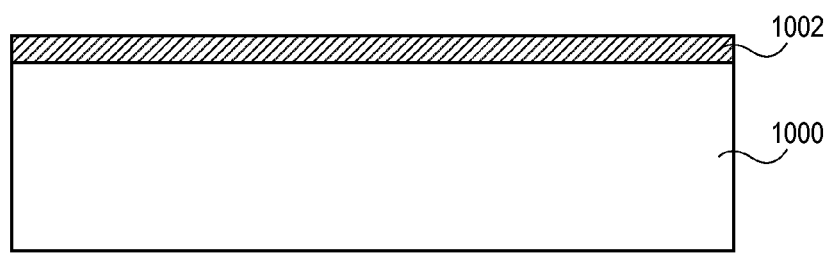
FIG. 10B illustrates a cross-sectional view of a substrate having a tunnel dielectric layer formed thereon, corresponding to operation 402 from the Flowchart of FIG. 4, in accordance with an embodiment of the present invention.

FIG. 10B illustrates a cross-sectional view of a substrate having a tunnel dielectric layer formed thereon, corresponding to operation 902 from the Flowchart of FIG. 9, in accordance with an embodiment of the present invention. Referring to operation 902 of Flowchart 900 and corresponding FIG. 10B, substrate 1000 is subjected to a first radical oxidation process in a first process chamber of the cluster tool to form a first dielectric layer 1002.

First dielectric layer 1002 may be composed of a material and have a thickness suitable to allow charge carriers to tunnel into a subsequently formed charge-trapping layer under an applied gate bias, while maintaining a suitable barrier to leakage when a subsequently formed nonvolatile charge trap memory device is unbiased. In accordance with an embodiment of the present invention, first dielectric layer 1002 is formed by an oxidation process where the top surface of substrate 1000 is consumed. Thus, in an embodiment, first dielectric layer 1002 is composed of an oxide of the material of substrate 1000. For example, in one embodiment, substrate 1000 is composed of silicon and first dielectric layer 1002 is composed of silicon dioxide. In a specific embodiment, first dielectric layer 1002 is formed to a thickness approximately in the range of 1-10 nanometers. In a particular embodiment, first dielectric layer 1002 is formed to a thickness approximately in the range of 1.5-2.5 nanometers.

First dielectric layer 1002 may be formed by a radical oxidation process. In accordance with an embodiment of the present invention, the radical oxidation process involves flowing hydrogen ($H_2$) and oxygen ($O_2$) gas into an oxidation chamber, such as the oxidation chambers 804 or 808 described in association with FIG. 8. In one embodiment, the partial pressures of $H_2$ and $O_2$ have a ratio to one another approximately in the range of 1:50-1:5. However, in an embodiment, an ignition event is not carried out which would otherwise typically be used to pyrolyze the $H_2$ and $O_2$ to form steam. Instead, $H_2$ and $O_2$ are permitted to react to form radicals at the surface of substrate 1000. In one embodiment, the radicals are used to consume the top portion of substrate 1000 to provide first dielectric layer 1002. In a specific embodiment, the radical oxidation process includes oxidizing with a radical such as, but not limited to, an OH radical, an $HO_2$ radical or an O diradical. In a particular embodiment, the radical oxidation process is carried out at a temperature approximately in the range of 950-1100 degrees Celsius at a pressure approximately in the range of 5-15 Torr. In one embodiment, the radical oxidation process is carried out for a duration approximately in the range of 1-3 minutes. In accordance with an embodiment of the present invention, first dielectric layer 1002 is formed as a high-density, low-hydrogen-content film.

Referring to operation 904 of Flowchart 900, subsequent to forming first dielectric layer 1002, but prior to any further processing, first dielectric layer 1002 may be subjected to a nitridation process. In an embodiment, the nitridation process is carried out in the same process chamber used to form first dielectric layer 1002. In one embodiment, first dielectric layer 1002 is annealed in the first process chamber, wherein the annealing includes heating substrate 1000 in an atmosphere including nitrogen at a temperature approximately in the range of 900-1100 degrees Celsius for a duration approximately in the range of 30 seconds-60 seconds. In one embodiment, the atmosphere including nitrogen is composed of a gas such as, but not limited to, nitrogen ($N_2$), nitrous oxide ($N_2O$), nitrogen dioxide ($NO_2$), nitric oxide (NO) or ammonia ($NH_3$). In another embodiment, the nitridation occurs in a separate process chamber. Alternatively, this nitridation step may be skipped.

Figure 10C:
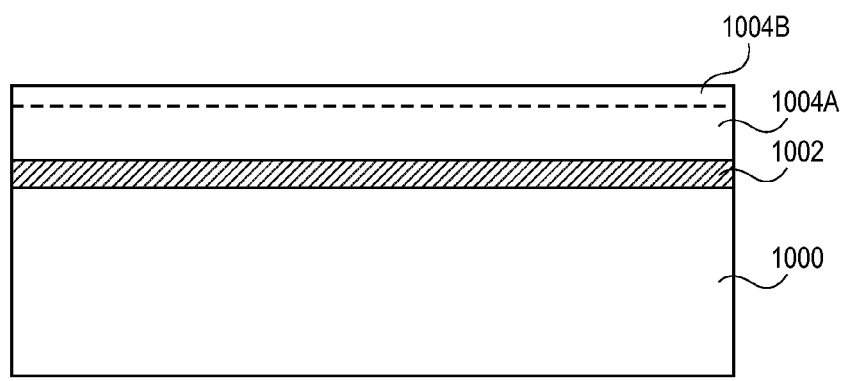
FIG. 10C illustrates a cross-sectional view of a substrate having a charge-trapping layer formed thereon, corresponding to operation 406 from the Flowchart of FIG. 4, in accordance with an embodiment of the present invention.

FIG. 10C illustrates a cross-sectional view of a substrate having a charge-trapping layer formed thereon, corresponding to operation 906 from the Flowchart of FIG. 9, in accordance with an embodiment of the present invention. Referring to operation 906 of Flowchart 900 and corresponding FIG. 10C, a charge-trapping layer having a first region 1004A and a second region 1004B is formed on first dielectric layer 1002 in the second process chamber of a cluster tool.

The charge-trapping layer may be composed of a material and have a thickness suitable to store charge and, hence, change the threshold voltage of a subsequently formed gate stack. In accordance with an embodiment of the present invention, the charge-trapping layer is composed of two regions 1004A and 1004B, as depicted in FIG. 10C. In an embodiment, region 1004A of the charge-trapping layer will remain as an intact charge-trapping layer following subsequent process operations. However, in that embodiment, region 1004B of the as-formed charge-trapping layer will be consumed to form a second dielectric layer, above region 1004A. In one embodiment, regions 1004A and 1004B of the charge-trapping layer are formed in the same process step and are composed of the same material.

The charge-trapping layer having regions 1004A and 1004B may be formed by a chemical vapor deposition process. In accordance with an embodiment of the present invention, the charge-trapping layer is composed of a material such as, but not limited to, silicon nitride, silicon oxy-nitride, oxygen-rich silicon oxy-nitride or silicon-rich silicon oxy-nitride. In an embodiment, the charge-trapping layer is formed on first dielectric layer 1002 in a low-pressure chemical vapor deposition chamber, such as the SiNgen™ low-pressure chemical vapor deposition chamber described in association with process chamber 806 from FIG. 8. In one embodiment, the second process chamber is a low-pressure chemical vapor deposition chamber and regions 1004A and 1004B of the charge-trapping layer are formed at a temperature less than the temperature used to form first dielectric layer 1002. In a specific embodiment, regions 1004A and 1004B of the charge-trapping layer are formed at a temperature approximately in the range of 700-850 degrees Celsius. In an embodiment, the second process chamber is a low-pressure chemical vapor deposition chamber and the charge-trapping layer is formed by using gases such as, but not limited to, dichlorosilane ($H_2SiCl_2$), bis-(tert-butylamino)silane (BTBAS), ammonia ($NH_3$) or nitrous oxide ($N_2O$). In accordance with an embodiment of the present invention, the charge-trapping layer is formed to a total thickness approximately in the range of 5-15 nanometers and region 1004B accounts for a thickness approximately in the range of 2-3 nanometers of the total thickness of the charge-trapping layer. In that embodiment, region 1004A accounts for the remaining total thickness of the charge-trapping layer, i.e. the portion of the charge-trapping layer that is not subsequently consumed to form a top or blocking dielectric layer.

In another aspect of the present invention, the charge-trapping layer may include multiple composition regions. For example, in accordance with an embodiment of the present invention, the charge-trapping layer includes an oxygen-rich portion and a silicon-rich portion and is formed by depositing an oxygen-rich oxy-nitride film by a first composition of gases in the second process chamber and, subsequently, depositing a silicon-rich oxy-nitride film by a second composition of gases in the second process chamber. In one embodiment, the charge-trapping layer is formed by modifying the flow rate of ammonia ($NH_3$) gas, and introducing nitrous oxide ($N_2O$) and dichlorosilane ($SiH_2Cl_2$) to provide the desired gas ratios to yield first an oxygen-rich oxy-nitride film and then a silicon-rich oxy-nitride film. In a specific embodiment, the oxygen-rich oxy-nitride film is formed by introducing a process gas mixture including $N_2O$, $NH_3$ and $SiH_2Cl_2$, while maintaining the chamber at a pressure approximately in the range of 0.5-500 Torr, and maintaining substrate 1000 at a temperature approximately in the range of 700-850 degrees Celsius, for a period approximately in the range of 2.5-20 minutes. In a further embodiment, the process gas mixture includes $N_2O$ and $NH_3$ having a ratio of from about 8:1 to about 1:8 and $SiH_2Cl_2$ and $NH_3$ having a ratio of from about 1:7 to about 7:1, and can be introduced at a flow rate approximately in the range of 5-200 standard cubic centimeters per minute (sccm). In another specific embodiment, the silicon-rich oxy-nitride film is formed by introducing a process gas mixture including $N_2O$, $NH_3$ and $SiH_2Cl_2$, while maintaining the chamber at a pressure approximately in the range of 0.5-500 Torr, and maintaining substrate 1000 at a temperature approximately in the range of 700-850 degrees Celsius, for a period approximately in the range of 2.5-20 minutes. In a further embodiment, the process gas mixture includes $N_2O$ and $NH_3$ having a ratio of from about 8:1 to about 1:8 and $SiH_2Cl_2$ and $NH_3$ mixed in a ratio of from about 1:7 to about 7:1, introduced at a flow rate of from about 5 to about 20 sccm. In accordance with an embodiment of the present invention, the charge-trapping layer comprises a bottom oxygen-rich silicon oxy-nitride portion having a thickness approximately in the range of 2.5-3.5 nanometers and a top silicon-rich silicon oxy-nitride portion having a thickness approximately in the range of 9-10 nanometers. In one embodiment, a region 1004B of charge-trapping layer accounts for a thickness approximately in the range of 2-3 nanometers of the total thickness of the top silicon-rich silicon oxy-nitride portion of the charge-trapping layer. Thus, region 1004B, which is targeted for subsequent consumption to form a second dielectric layer, may be composed entirely of silicon-rich silicon oxy-nitride.

Figure 10D:
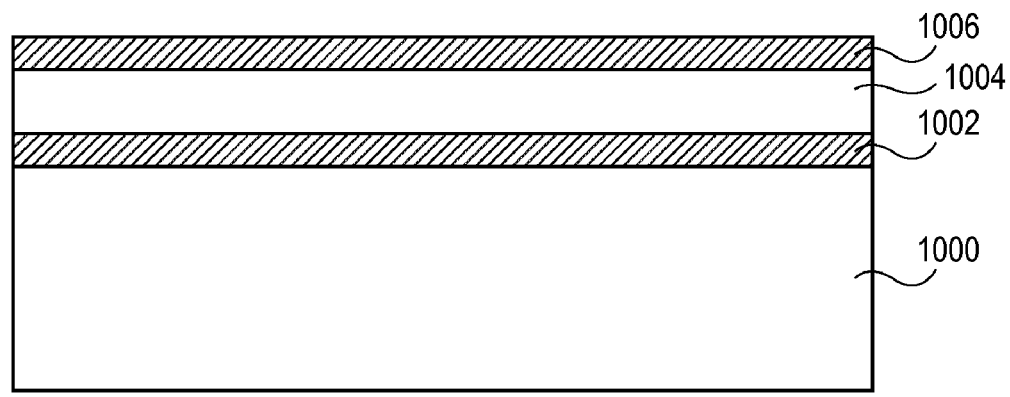
FIG. 10D illustrates a cross-sectional view of a substrate having a top dielectric layer formed thereon, corresponding to operation 408 from the Flowchart of FIG. 4, in accordance with an embodiment of the present invention.

FIG. 10D illustrates a cross-sectional view of a substrate having a top dielectric layer formed thereon, corresponding to operation 908 from the Flowchart of FIG. 9, in accordance with an embodiment of the present invention. Referring to operation 908 of Flowchart 900 and corresponding FIG. 10D, a second dielectric layer 1006 is formed on charge-trapping layer 1004 in the first process chamber of the cluster tool.

Second dielectric layer 1006 may be composed of a material and have a thickness suitable to maintain a barrier to charge leakage without significantly decreasing the capacitance of a subsequently formed gate stack in a nonvolatile charge trap memory device. In accordance with an embodiment of the present invention, second dielectric layer 1006 is formed by consuming region 1004B of the charge trapping layer formed in operation 906, described in association with FIG. 10C. Thus, in one embodiment region 1004B is consumed to provide second dielectric layer 1006, while region 1004A remains a charge-trapping layer 1004. In a specific embodiment, region 1004B is a silicon-rich silicon oxy-nitride region having a thickness approximately in the range of 2-3 nanometers and is oxidized to form second dielectric layer 1006 having a thickness approximately in the range of 3.5-4.5 nanometers. In that embodiment, second dielectric layer 1006 is composed of silicon dioxide.

Second dielectric layer 1006 may be formed by a second radical oxidation process. In accordance with an embodiment of the present invention, the second radical oxidation process involves flowing hydrogen ($H_2$) and oxygen ($O_2$) gas into an oxidation chamber, such as the oxidation chambers 804 or 808 described in association with FIG. 8. In one embodiment, the partial pressures of $H_2$ and $O_2$ have a ratio to one another approximately in the range of 1:50-1:5. However, in an embodiment, an ignition event is not carried out which would otherwise typically be used to pyrolyze the $H_2$ and $O_2$ to form steam. Instead, $H_2$ and $O_2$ are permitted to react to form radicals at the surface of region 1004B. In one embodiment, the radicals are used to consume region 1004B to provide second dielectric layer 1006. In a specific embodiment, the second radical oxidation process includes oxidizing with a radical such as, but not limited to, an OH radical, an $HO_2$ radical or an O diradical. In a particular embodiment, the second radical oxidation process is carried out at a temperature approximately in the range of 950-1100 degrees Celsius at a pressure approximately in the range of 5-15 Torr. In one embodiment, the second radical oxidation process is carried out for a duration approximately in the range of 1-3 minutes.

In accordance with an embodiment of the present invention, first dielectric layer 1002 is formed as a high-density, low-hydrogen-content film. In one embodiment, no additional deposition step is required to form a complete second dielectric layer 1006, as depicted in FIG. 10D and shown in Flowchart 900. Depending on wafer pass-through logistics in the cluster tool, the second radical oxidation process may be carried out in the same, i.e. first, chamber as the first radical oxidation process used to form first dielectric layer 1002 or in a different, e.g. third, process chamber of the cluster tool. Thus, in accordance with an embodiment of the present invention, reference to a first process chamber can be used to mean reintroduction into the first process chamber or to mean introduction into a process chamber different from the first process chamber.

Referring to operation 910 of Flowchart 900, subsequent to forming second dielectric layer 1006, but prior to removing substrate 1000 from the cluster tool, second dielectric layer 1006 may be further subjected to a nitridation process in the first process chamber. In accordance with an embodiment of the present invention, the nitridation process includes annealing second dielectric layer 1006 in an atmosphere including nitrogen at a temperature approximately in the range of 900-1100 degrees Celsius for a duration approximately in the range of 30 seconds-60 seconds. In one embodiment, the atmosphere including nitrogen is composed of a gas such as, but not limited to, nitrogen ($N_2$), nitrous oxide ($N_2O$), nitrogen dioxide ($NO_2$), nitric oxide (NO) or ammonia ($NH_3$). Alternatively, this nitridation step, i.e. operation 910 from Flowchart 900, may be skipped and the wafer unloaded from the cluster tool.

Thus, in accordance with an embodiment of the present invention, an ONO stack including first dielectric layer 1002, charge-trapping layer 1004 and second dielectric layer 1006 is formed in a single pass in a cluster tool. By fabricating these layers in a single pass in the cluster tool, pristine interfaces between first dielectric layer 1002 and charge-trapping layer 1004 and between charge-trapping layer 1004 and second dielectric layer 1006 may be preserved. In one embodiment, first dielectric layer 1002, charge-trapping layer 1004 and second dielectric layer 1006 are formed without breaking vacuum in the cluster tool. In one embodiment, each layer is formed at a different temperature to tailor film properties without incurring significant ramp time penalties. Furthermore, by fabricating these layers in a cluster tool, as opposed to fabricating in batch processing tools, the overall uniformity of the stack of layers may be optimized. For example, in accordance with an embodiment of the present invention, by fabricating layers 1002, 1004 and 1006 in a cluster tool, the variability in thickness of the stack of layers 1002, 1004 and 1006 across a single wafer may be reduced by as much as approximately 30%. In an exemplary embodiment, 1 σ is approximately in the range of 1-2% of the thickness of first dielectric layer 1002. In a specific embodiment, the cluster tool is a single-wafer cluster tool.

Figure 10E:
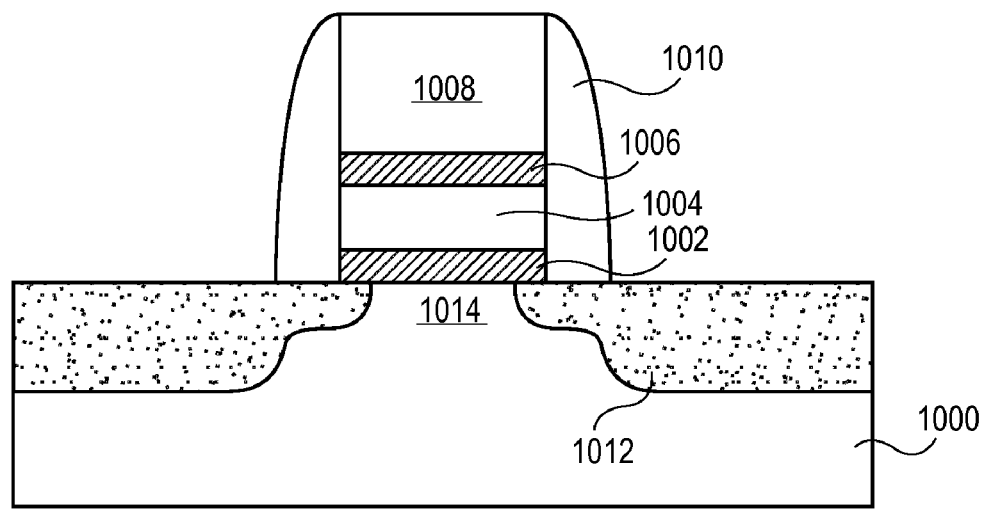
FIG. 10E illustrates a cross-sectional view of a nonvolatile charge trap memory device, in accordance with an embodiment of the present invention.

Upon fabrication of an ONO stack including first dielectric layer 1002, charge-trapping layer 1004 and second dielectric layer 1006, a nonvolatile charge trap memory device may be fabricated to include a patterned portion of the ONO stack. FIG. 10E illustrates a cross-sectional view of a nonvolatile charge trap memory device, in accordance with an embodiment of the present invention.

Referring to FIG. 10E, a nonvolatile charge trap memory device includes a patterned portion of the ONO stack formed over substrate 1000. The ONO stack includes first dielectric layer 1002, charge-trapping layer 1004 and second dielectric layer 1006. A gate layer 1008 is disposed on second dielectric layer 1006. The nonvolatile charge trap memory device further includes source and drain regions 1012 in substrate 1000 on either side of the ONO stack, defining a channel region 1014 in substrate 1000 underneath the ONO stack. A pair of dielectric spacers 1010 isolates the sidewalls of first dielectric layer 1002, charge-trapping layer 1004, second dielectric layer 1006 and gate layer 1008. In a specific embodiment, channel region 1014 is doped P-type and, in an alternative embodiment, channel region 1014 is doped N-type.

In accordance with an embodiment of the present invention, the nonvolatile charge trap memory device described in association with FIG. 10E is a SONOS-type device. By convention, SONOS stands for "Semiconductor-Oxide-Nitride-Oxide -Semiconductor," where the first "Semiconductor" refers to the channel region material, the first "Oxide" refers to the tunnel dielectric layer, "Nitride" refers to the charge-trapping dielectric layer, the second "Oxide" refers to the top dielectric layer (also known as a blocking dielectric layer) and the second "Semiconductor" refers to the gate layer. Thus, in accordance with an embodiment of the present invention, first dielectric layer 1002 is a tunnel dielectric layer and second dielectric layer 1006 is a blocking dielectric layer.

Gate layer 1008 may be composed of any conductor or semiconductor material suitable for accommodating a bias during operation of a SONOS-type transistor. In accordance with an embodiment of the present invention, gate layer 1008 is formed by a chemical vapor deposition process and is composed of doped poly-crystalline silicon. In another embodiment, gate layer 1008 is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt or nickel.

Source and drain regions 1012 in substrate 1000 may be any regions having opposite conductivity to channel region 1014. For example, in accordance with an embodiment of the present invention, source and drain regions 1012 are N-type doped regions while channel region 1014 is a P-type doped region. In one embodiment, substrate 1000 and, hence, channel region 1014, is composed of boron-doped single-crystal silicon having a boron concentration in the range of $1 \times 10^{15}$-$1 \times 10^{19}$ atoms/cm$^3$. In that embodiment, source and drain regions 1012 are composed of phosphorous- or arsenic-doped regions having a concentration of N-type dopants in the range of $5 \times 10^{16}$-$5 \times 10^{19}$ atoms/cm$^3$. In a specific embodiment, source and drain regions 1012 have a depth in substrate 1000 in the range of 80-200 nanometers. In accordance with an alternative embodiment of the present invention, source and drain regions 1012 are P-type doped regions while channel region 1014 is an N-type doped region.

Figure 11:
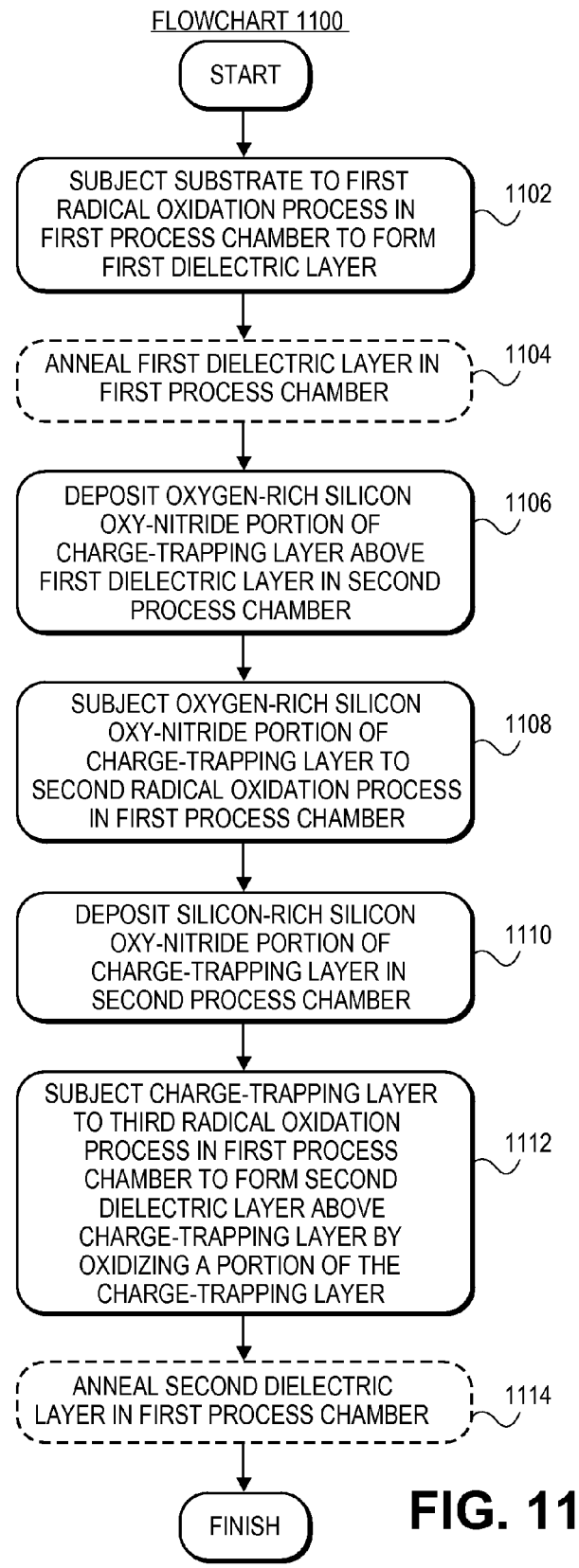
FIG. 11 depicts a Flowchart representing a series of operations in a method for fabricating a nonvolatile charge trap memory device, in accordance with an embodiment of the present invention.

In another aspect of the present invention, a charge-trapping layer may include multiple composition regions, where the composition region closest to a tunnel dielectric layer is subjected to a radical oxidation process. FIG. 11 depicts a Flowchart 1100 representing a series of operations in a method for fabricating a nonvolatile charge trap memory device, in accordance with an embodiment of the present invention. FIGS. 12A-12E illustrate cross-sectional views representing operations in the fabrication of a nonvolatile charge trap memory device, in accordance with an embodiment of the present invention.

Figure 12A:
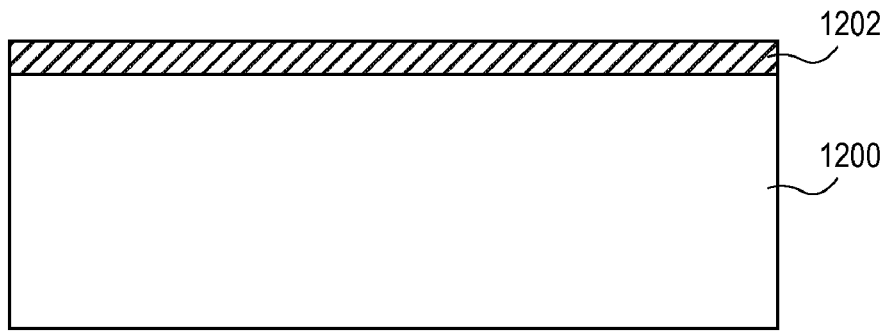
FIG. 12A illustrates a cross-sectional view of a substrate having a tunnel dielectric layer formed thereon, corresponding to operation 602 from the Flowchart of FIG. 6, in accordance with an embodiment of the present invention.

FIG. 12A illustrates a cross-sectional view of a substrate having a first dielectric layer formed thereon, corresponding to operation 1102 from the Flowchart of FIG. 11, in accordance with an embodiment of the present invention. Referring to operation 1102 of Flowchart 1100 and corresponding FIG.

12A, substrate 1200 is subjected to a first radical oxidation process in a first process chamber of a cluster tool to form a first dielectric layer 1202. Substrate 1200 and first dielectric layer 1202 may be composed of materials described in association with substrate 1000 and first dielectric layer 1002 from FIGS. 10A and 10B, respectively. The radical oxidation process used to form first dielectric layer 1202 may be similar to the radical oxidation process used to form first dielectric layer 1002, described in association with FIG. 10B.

Referring to operation 1104 of Flowchart 1100, subsequent to forming first dielectric layer 1202, but prior to any further processing, first dielectric layer 1202 may be subjected to a nitridation process. The nitridation process may be similar to the nitridation process described in association with operation 904 of Flowchart 900. In one embodiment, the nitridation process is carried out in the same process chamber used to form first dielectric layer 1202. In another embodiment, the nitridation occurs in a separate process chamber. Alternatively, this nitridation step may be skipped.

Figure 12B:
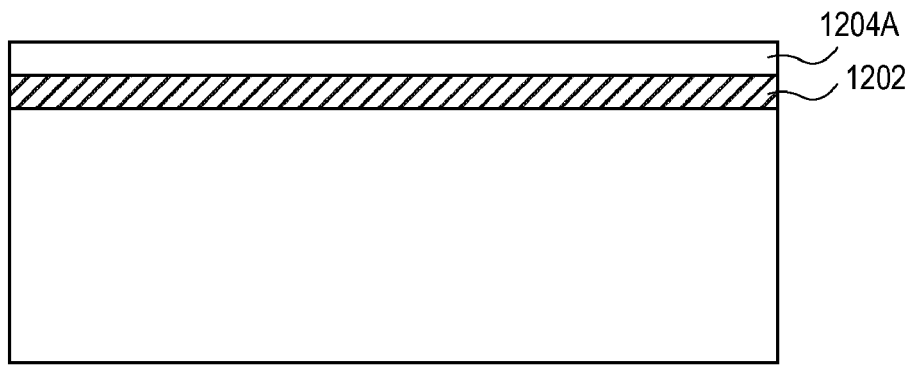
FIG. 12B illustrates a cross-sectional view of a substrate having an oxygen-rich silicon oxy-nitride portion of a charge-trapping layer formed thereon, corresponding to operation 606 from the Flowchart of FIG. 6, in accordance with an embodiment of the present invention.

FIG. 12B illustrates a cross-sectional view of a substrate having an oxygen-rich silicon oxy-nitride portion of a charge-trapping layer formed thereon, corresponding to operation 1106 from the Flowchart of FIG. 11, in accordance with an embodiment of the present invention. Referring to operation 1106 of Flowchart 1100 and corresponding FIG. 12B, an oxygen-rich silicon oxy-nitride portion 1204A is formed on first dielectric layer 1202 in a second process chamber of the cluster tool. Oxygen-rich silicon oxy-nitride portion 1204A may be composed of an oxygen-rich silicon oxy-nitride material and formed by a technique described in association with first region 1004A from FIG. 10C.

Referring to operation 1108 from Flowchart 1100, in accordance with an embodiment of the present invention, oxygen-rich silicon oxy-nitride portion 1204A is subjected to a second radical oxidation process in the first process chamber of the cluster tool. The second radical oxidation process may be similar to one of the radical oxidation processes used to form first dielectric layer 1002 or second dielectric layer 1006, described in association with FIGS. 10B and 10D, respectively. In an embodiment, carrying out the second radical oxidation process is made possible because oxygen-rich silicon oxy-nitride portion 1204A is maintained in the environment within the tool and thus retains a pristine surface. In one embodiment, the second radical oxidation process densifies oxygen-rich silicon oxy-nitride portion 1204A. Depending on wafer pass-through logistics in the cluster tool, the second radical oxidation process may be carried out in the same, i.e. first, chamber as the radical oxidation process used to form first dielectric layer 1202 or in a different, e.g. third, process chamber. Thus, in accordance with an embodiment of the present invention, reference to a first process chamber can be used to mean reintroduction into the first process chamber or to mean introduction into a process chamber different from the first process chamber.

Figure 12C:
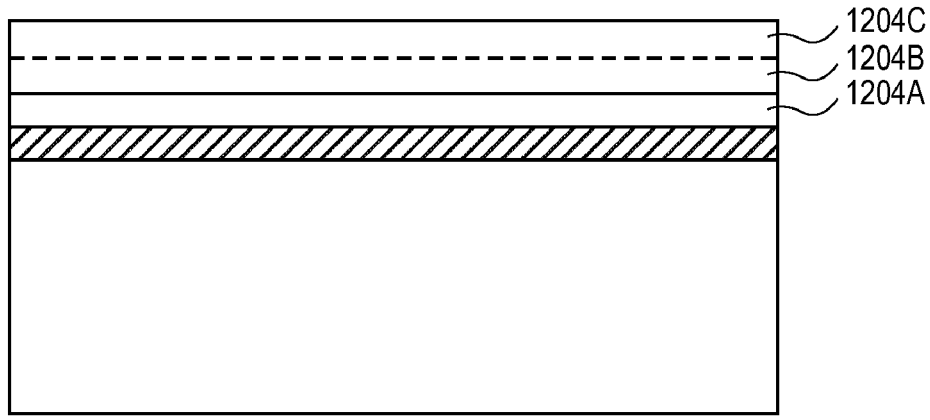
FIG. 12C illustrates a cross-sectional view of a substrate having a silicon-rich silicon oxy-nitride portion of a charge-trapping layer formed thereon, corresponding to the operation 610 from the Flowchart of FIG. 6, in accordance with an embodiment of the present invention.

FIG. 12C illustrates a cross-sectional view of a substrate having a silicon-rich silicon oxy-nitride portion of a charge-trapping layer formed thereon, corresponding to operation 1110 from the Flowchart of FIG. 11, in accordance with an embodiment of the present invention. Referring to operation 1110 of Flowchart 1100 and corresponding FIG. 12C, a silicon-rich silicon oxy-nitride portion having a first region 1204B and a second region 1204C is formed on oxygen-rich silicon oxy-nitride portion 1204A in the second process chamber of the cluster tool. The silicon-rich silicon oxy-nitride portion may be composed of a silicon-rich silicon oxy-nitride material and formed by a technique described in association with second region 1004B from FIG. 10C. Depending on wafer pass-through logistics in the cluster tool, the deposition of silicon-rich silicon oxy-nitride portion of the charge-trapping layer may be carried out in the same, i.e. second, chamber as the deposition of oxygen-rich silicon oxy-nitride portion 1204A of the charge-trapping layer or in a different process chamber. Thus, in accordance with an embodiment of the present invention, reference to a second process chamber can be used to mean reintroduction into the second process chamber or to mean introduction into a process chamber different from the second process chamber.

Figure 12D:
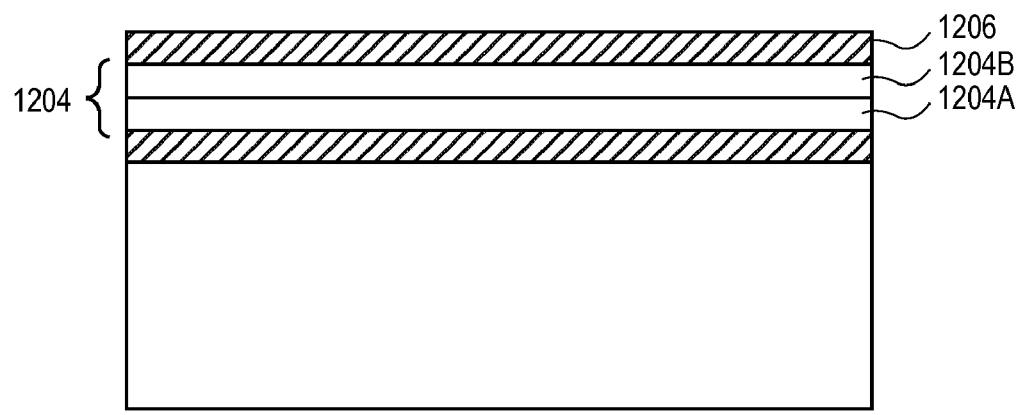
FIG. 12D illustrates a cross-sectional view of a substrate having a top dielectric layer formed thereon, corresponding to operation 612 from the Flowchart of FIG. 6, in accordance with an embodiment of the present invention.

FIG. 12D illustrates a cross-sectional view of a substrate having a top dielectric layer formed thereon, corresponding to operation 1112 from the Flowchart of FIG. 11, in accordance with an embodiment of the present invention. Referring to operation 1112 of Flowchart 1100 and corresponding FIG. 12D, a second dielectric layer 1206 is formed on charge-trapping layer 1204 in the first process chamber of the cluster tool. In accordance with an embodiment of the present invention, second dielectric layer 1206 is formed by consuming second region 1204C of the silicon-rich silicon oxy-nitride portion by a third radical oxidation process. Thus, in one embodiment, the remaining charge-trapping layer 1204 between first dielectric layer 1202 and second dielectric layer 1204 is composed of oxygen-rich silicon oxy-nitride portion 1204A and first region 1204B of the silicon-rich silicon oxy-nitride portion 1204, as depicted in FIG. 12D. The third radical oxidation process used to consume second region 1204C of the silicon-rich silicon oxy-nitride portion to provide second dielectric layer 1206 may be similar to the radical oxidation process used to form second dielectric layer 1006, described in association with FIG. 10D. Depending on wafer pass-through logistics in the cluster tool, the third radical oxidation process may be carried out in the same, i.e. first, chamber as the radical oxidation process used to form first dielectric layer 1202 or in a different, e.g. third, process chamber. Thus, in accordance with an embodiment of the present invention, reference to a first process chamber can be used to mean reintroduction into the first process chamber or to mean introduction into a process chamber different from the first process chamber.

Referring to operation 1114 of Flowchart 1100, subsequent to forming second dielectric layer 1206, but prior to removing substrate 1200 from the cluster tool, second dielectric layer 1206 may be further subjected to a nitridation process in the first process chamber. The nitridation process may be similar to the nitridation process described in association with operation 910 from Flowchart 900. In one embodiment, the nitridation process is carried out in the same process chamber used to form second dielectric layer 1206. In another embodiment, the nitridation occurs in a separate process chamber. Alternatively, this nitridation step may be skipped.

Figure 12E:
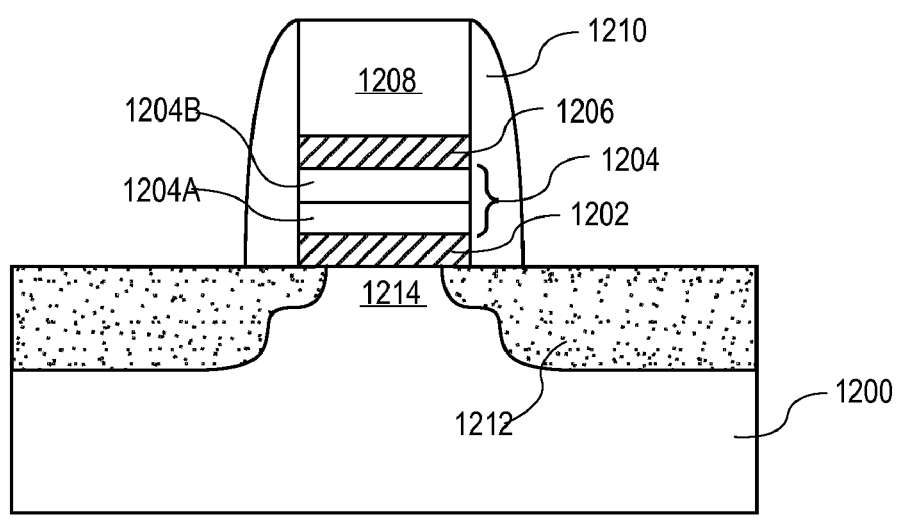
FIG. 12E illustrates a cross-sectional view of a nonvolatile charge trap memory device, in accordance with an embodiment of the present invention.

Upon fabrication of an ONO stack including first dielectric layer 1202, charge-trapping layer 1204 and second dielectric layer 1206, a nonvolatile charge trap memory device may be fabricated to include a patterned portion of the ONO stack. FIG. 12E illustrates a cross-sectional view of a nonvolatile charge trap memory device, in accordance with an embodiment of the present invention.

Referring to FIG. 12E, a nonvolatile charge trap memory device includes a patterned portion of the ONO stack formed over substrate 1200. The ONO stack includes first dielectric layer 1202, charge-trapping layer 1204 and second dielectric layer 1206. A gate layer 1208 is disposed on second dielectric layer 1206. The nonvolatile charge trap memory device further includes source and drain regions 1212 in substrate 1200 on either side of the ONO stack, defining a channel region 1214 in substrate 1200 underneath the ONO stack. A pair of dielectric spacers 1210 isolates the sidewalls of first dielectric layer 1202, charge-trapping layer 1204, second dielectric layer 1206 and gate layer 1208. In accordance with an embodiment of the present invention, charge-trapping layer 1204 is composed of an oxygen-rich silicon oxy-nitride portion 1204A and a silicon-rich silicon oxy-nitride portion 1204B, as depicted in FIG. 12E. In one embodiment, the nonvolatile charge trap memory device is a SONOS-type device. Gate layer 1208, source and drain regions 1212 and channel region 1214 may be composed of materials described in association with gate layer 1008, source and drain regions 1012 and channel region 1014 from FIG. 10E.

Figure 13A:
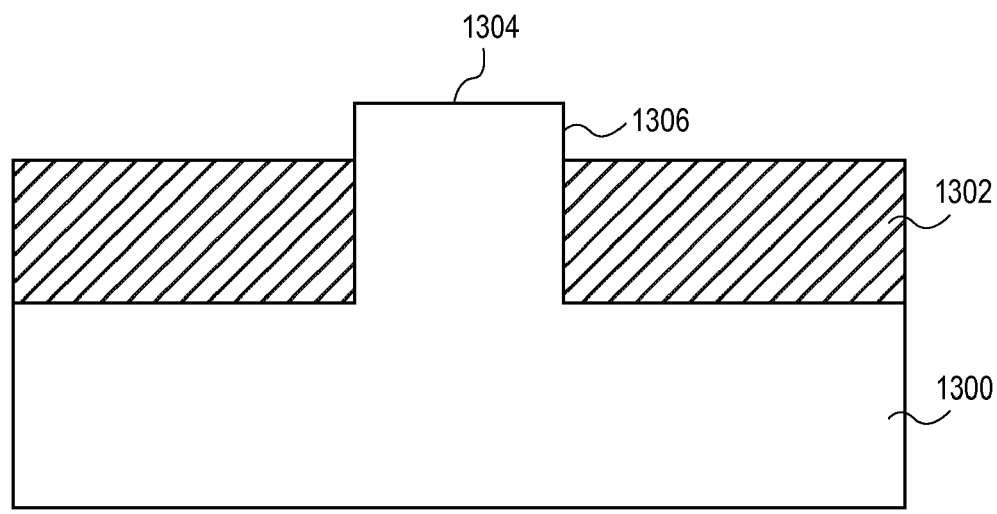
FIG. 13A illustrates a cross-sectional view of a substrate including first and second exposed crystal planes, in accordance with an embodiment of the present invention.

In another aspect of the present invention, a dielectric layer formed by radical oxidation of the top surface of a substrate in an oxidation chamber may be less susceptible to crystal plane orientation differences in the substrate upon which it is grown. For example, in one embodiment, the cornering effect caused by differential crystal plane oxidation rates is significantly reduced by forming a dielectric layer in an oxidation chamber of a cluster tool. FIG. 13A illustrates a cross-sectional view of a substrate including first and second exposed crystal planes, in accordance with an embodiment of the present invention.

Referring to FIG. 13A, a substrate 1300 has isolation regions 1302 formed thereon. Substrate 1300 may be composed of a material described in association with substrate 1000 from FIG. 10A. Isolation regions 1302 may be composed of an insulating material suitable for adhesion to substrate 1300. An exposed portion of substrate 1300 extends above the top surface of isolation regions 1302. In accordance with an embodiment of the present invention, the exposed portion of substrate 1300 has a first exposed crystal plane 1304 and a second exposed crystal plane 1306. In one embodiment, the crystal orientation of first exposed crystal plane 1304 is different from the crystal orientation of second exposed crystal plane 1306. In a specific embodiment, substrate 1300 is composed of silicon, first exposed crystal plane 1304 has <100> orientation, and second exposed crystal plane 1306 has <110> orientation.

Figure 13B:
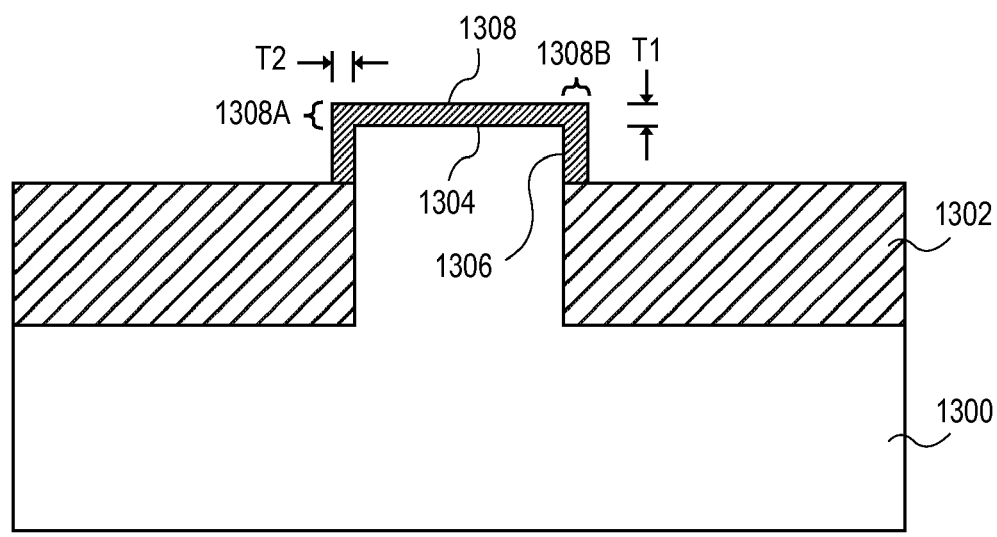
FIG. 13B illustrates a cross-sectional view of the substrate including first and second crystal planes and having a dielectric layer formed thereon, in accordance with an embodiment of the present invention.

Substrate 1300 may be subjected to a radical oxidation process in a cluster tool to form a dielectric layer by consuming (oxidizing) the top surface of substrate 1300. In one embodiment, the oxidizing of substrate 1300 by a radical oxidation process includes oxidizing with a radical selected from the group consisting of an OH radical, an HO$_2$ radical or an O diradical. FIG. 13B illustrates a cross-sectional view of substrate 1300 including first and second crystal planes 1304 and 1306, respectively, and having a dielectric layer 1308 formed thereon, in accordance with an embodiment of the present invention. In an embodiment, first portion 1308A of dielectric layer 1308 is formed on first exposed crystal plane 1304 and a second portion 1308B of dielectric layer 1308 is formed on second exposed crystal plane 1306, as depicted in FIG. 13B. In one embodiment, the thickness T1 of first portion 1308A of dielectric layer 1308 is approximately equal to the thickness T2 of second portion 1308B of dielectric layer 1308, even though the crystal plane orientation of first exposed crystal plane 1304 and second exposed crystal plane 1306 differ. In a specific embodiment, the radical oxidation of substrate 1300 is carried out at a temperature approximately in the range of 950-1100 degrees Celsius at a pressure approximately in the range of 5-15 Torr. In one embodiment, subsequent to forming dielectric layer 1308, substrate 1300 is annealed in the oxidation chamber in an atmosphere including nitrogen at a temperature approximately in the range of 900-1100 degrees Celsius for a duration approximately in the range of 30 seconds-60 seconds.

Thus, a method for fabricating a nonvolatile charge trap memory device has been disclosed. In accordance with an embodiment of the present invention, a substrate is subjected to a first radical oxidation process to form a first dielectric layer in a first process chamber of a cluster tool. A charge-trapping layer may then be deposited above the first dielectric layer in a second process chamber of the cluster tool. In one embodiment, the charge-trapping layer is then subjected to a second radical oxidation process to form a second dielectric layer above the charge-trapping layer by oxidizing a portion of the charge-trapping layer in the first process chamber of the cluster tool. By forming all layers of an oxide-nitride-oxide (ONO) stack in a cluster tool, interface damage may be reduced between the respective layers. Thus, in accordance with an embodiment of the present invention, an ONO stack is fabricated in a single pass in a cluster tool in order to preserve a pristine interface between the layers in the ONO stack. In a specific embodiment, the cluster tool is a single-wafer cluster tool.

What is claimed is:

1. A method of fabricating a nonvolatile charge trap memory device, the method comprising:
   oxidizing a portion of a charge-trapping layer disposed above a substrate to form a blocking dielectric layer above the charge-trapping layer, the oxidizing performed by exposing the charge-trapping layer to a hydrogen and oxygen radical oxidation process, wherein the charge-trapping layer comprises a bottom oxygen-rich silicon oxy-nitride portion having a thickness approximately in the range of 2.5-3.5 nanometers and a top silicon-rich silicon oxy-nitride portion having a thickness approximately in the range of 9-10 nanometers, and wherein oxidizing the portion of the charge-trapping layer comprises oxidizing the top approximately 2 nanometers to approximately 3 nanometers of the top silicon-rich silicon oxy-nitride portion to form the blocking dielectric layer having a thickness approximately in the range of 3.5-4.5 nanometers.

2. A method of fabricating a nonvolatile charge trap memory device, comprising:
   subjecting, in a process chamber, a substrate to a first hydrogen and oxygen radical oxidation process to form a first dielectric layer;
   subjecting, in the process chamber, the substrate to a deposition process to form a charge-trapping layer above the first dielectric layer; and
   subjecting, in the process chamber, the substrate to a second hydrogen and oxygen radical oxidation process to form a second dielectric layer above the charge-trapping layer by oxidizing a portion of the charge-trapping layer, wherein the charge-trapping layer comprises a bottom oxygen-rich silicon oxy-nitride portion having a thickness approximately in the range of 2.5-3.5 nanometers and a top silicon-rich silicon oxy-nitride portion having a thickness approximately in the range of 9-10 nanometers, and wherein oxidizing the portion of the charge-trapping layer comprises oxidizing the top approximately 2 nanometers to approximately 3 nanometers of the top silicon-rich silicon oxy-nitride portion to form the second dielectric layer having a thickness approximately in the range of 3.5-4.5 nanometers.

3. A method of fabricating a nonvolatile charge trap memory device, comprising:
   subjecting a substrate to an oxidation process to form a first dielectric layer;

depositing a charge-trapping layer above the first dielectric layer, the charge-trapping layer comprising a bottom portion and a top portion; and subjecting the charge-trapping layer to a radical oxidation process to form a second dielectric layer above the charge-trapping layer by exposing the charge-trapping layer to a hydrogen ($H_2$) and oxygen ($O_2$) gas flow, forming radicals at a surface of the charge-trapping layer, and consuming a portion of the top portion of the charge-trapping layer to form the second dielectric layer, wherein the bottom portion of the charge-trapping layer comprises an oxygen-rich silicon oxy-nitride.

4. The method of claim 3, wherein the radical oxidation process does not include an ignition event to pyrolyze the $H_2$ and $O_2$ gas to form steam.

5. The method of claim 3, wherein the oxidation process to form the first dielectric layer is also a radical oxidation process comprising exposing the substrate to a $H_2$ and $O_2$ gas flow, and forming radicals at a surface of the substrate to form the second dielectric layer.

6. The method of claim 3, further comprising subjecting the second dielectric layer to a nitridation process by annealing the substrate in a nitrogen containing atmosphere.

* * * * *